United States Patent
Hikosaka et al.

(10) Patent No.: US 6,706,540 B2
(45) Date of Patent: Mar. 16, 2004

(54) METHOD OF MANUFACTURING A SEMICONDUCTOR DEVICE WITH A HYDROGEN BARRIER LAYER

(75) Inventors: Yukinobu Hikosaka, Kawasaki (JP); Yasutaka Ozaki, Kawasaki (JP); Kazuaki Takai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/361,585

(22) Filed: Feb. 11, 2003

(65) Prior Publication Data

US 2003/0148579 A1 Aug. 7, 2003

Related U.S. Application Data

(62) Division of application No. 09/819,738, filed on Mar. 29, 2001, now Pat. No. 6,570,203.

(30) Foreign Application Priority Data

Sep. 18, 2000 (JP) ........................................ 2000-282730

(51) Int. Cl.[7] .............................................. H01L 21/00
(52) U.S. Cl. ..................... 438/3; 257/295; 257/310; 438/240; 438/653
(58) Field of Search ................................ 257/295, 310; 438/3, 240, 653

(56) References Cited

U.S. PATENT DOCUMENTS

| | | | |
|---|---|---|---|
| 5,475,248 A | 12/1995 | Takenaka .................... 257/295 |
| 5,481,490 A | 1/1996 | Watanabe et al. ........... 365/145 |
| 5,510,651 A | 4/1996 | Maniar et al. ............... 257/751 |
| 5,780,351 A | 7/1998 | Arita et al. .................. 438/396 |
| 6,184,927 B1 | 2/2001 | Kang ...................... 348/240.99 |
| 6,200,821 B1 | 3/2001 | Baek ............................... 438/3 |
| 6,249,014 B1 * | 6/2001 | Bailey ........................ 257/295 |
| 6,355,952 B1 | 3/2002 | Yamoto et al. ............. 257/295 |
| 6,395,612 B1 * | 5/2002 | Amanuma .................. 438/393 |
| 6,469,333 B1 * | 10/2002 | Takai et al. ................. 257/295 |
| 6,492,222 B1 * | 12/2002 | Xing ........................... 438/240 |
| 6,495,879 B1 | 12/2002 | Kobayashi .................. 257/310 |
| 6,509,601 B1 * | 1/2003 | Lee et al. .................... 257/310 |
| 6,559,003 B2 * | 5/2003 | Hartner et al. ............... 438/253 |
| 6,570,203 B2 * | 5/2003 | Hikosaka et al. ........... 257/295 |
| 6,597,028 B2 * | 7/2003 | Fox et al. .................... 257/295 |

FOREIGN PATENT DOCUMENTS

| | | |
|---|---|---|
| EP | 0766319 A2 | 4/1997 |
| EP | 0 877 422 A1 | 11/1998 |
| JP | 61-276352 | 12/1986 |
| JP | 2-5416 | 1/1990 |
| JP | 7-111318 | 4/1995 |
| JP | 7-153921 | 6/1995 |
| JP | 7-235639 | 9/1995 |
| JP | 9-97883 | 4/1997 |

OTHER PUBLICATIONS

Park et al., Ultra–Thin EBL (Encapsulated Barrier Layer) for Ferroelectric Capacitor, *IEDM* (Dec. 1997) 617.*
Yang et al., Impurities in dielectrics and hydrogen barriers for $SrBi_2Ta_2O_9$–based ferroelectric memories, *Appl. Phys. Lett.*, 79 (Sep. 2001) 2064.*
Lan et al., Forming gas annealing on physical characteristics and electrical properties of $Sr_{0.8}Bi_2Ta_2O_9/Al_2O_3/Si$ capacitors, *J. Appl. Phys.*, 94 (Aug. 2003) 1877.*
Itoh et al: "Mass–Productive High Performance 0.5μm Embedded Fram Technology with Triple Layer Metal", 2000 Symposium on VLSI Technology. Digest of Technical Papers. Honolulu, Jun. 13–15, 2000, pp. 32–33.

\* cited by examiner

*Primary Examiner*—Michael S. Lebentritt
*Assistant Examiner*—Christian D. Wilson
(74) *Attorney, Agent, or Firm*—Armstrong, Kratz, Quintos, Hanson & Brooks, LLP

(57) ABSTRACT

There is provided a semiconductor device which includes a capacitor including a lower electrode, a dielectric film, and an upper electrode, a first protection film formed on the capacitor, a first wiring formed on the first protection film, a first insulating film formed on the first wiring, a second wiring formed on the first insulating film, a second insulating film formed on the second wiring, and at least one of a second protection film formed between the first insulating film and the first wiring to cover at least the capacitor and a third protection film formed on the second insulating film to cover the capacitor and set to an earth potential. Accordingly, the degradation of the ferroelectric capacitor formed under the multi-layered wiring structure can be suppressed.

8 Claims, 25 Drawing Sheets

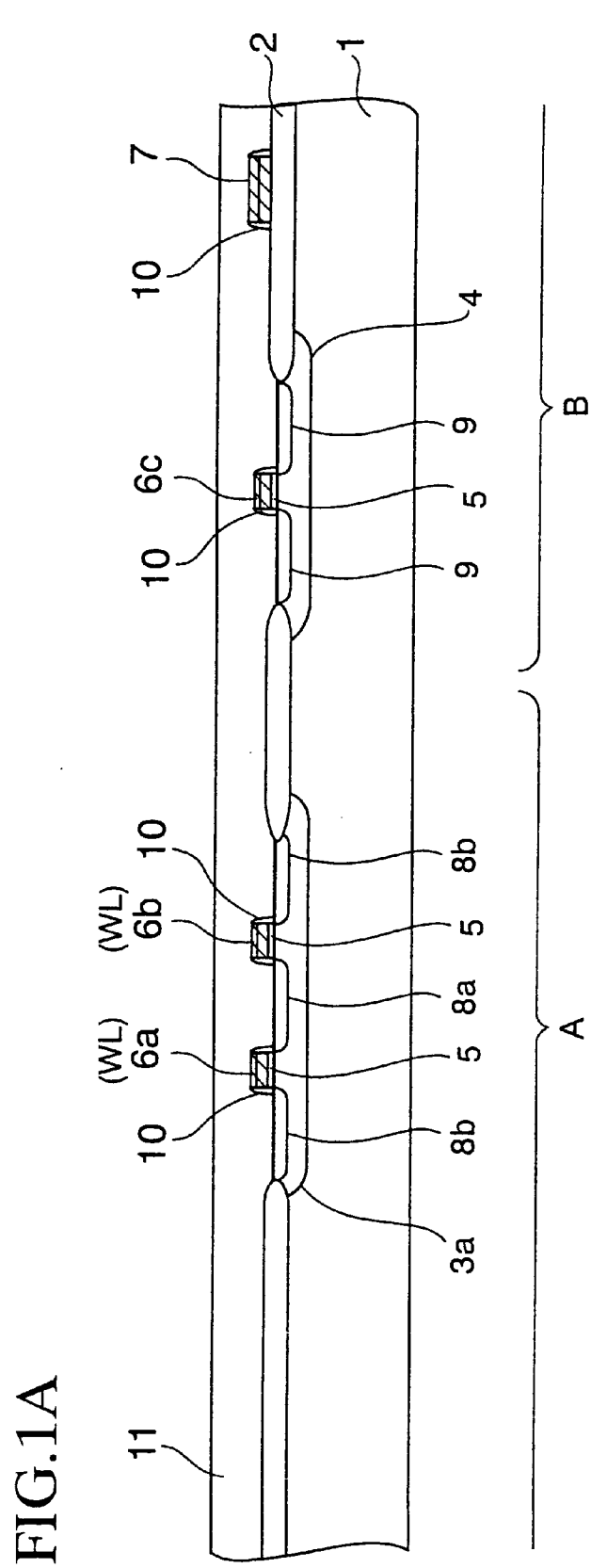

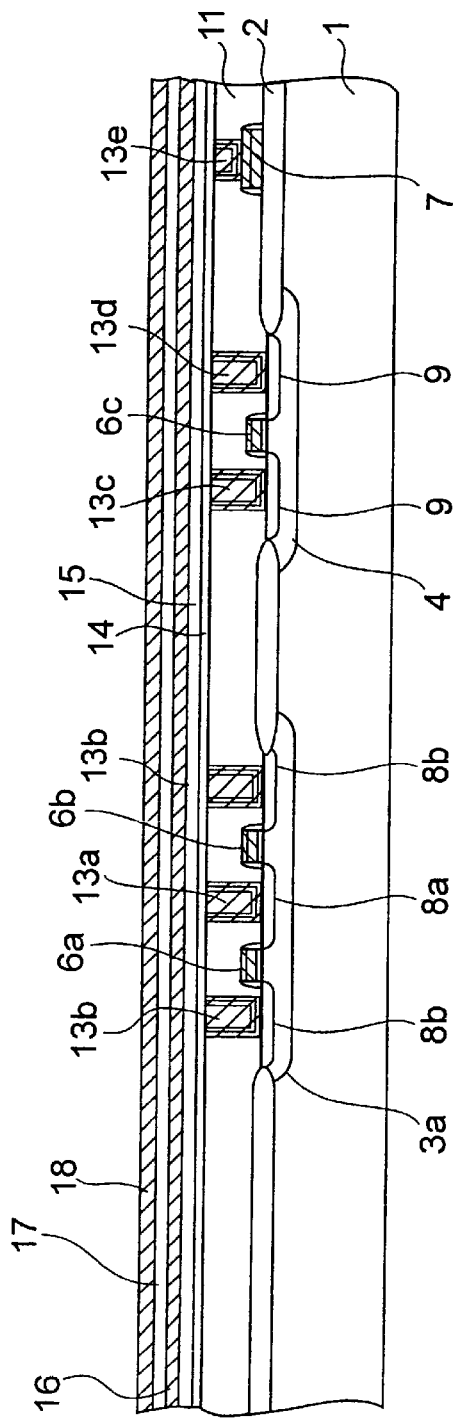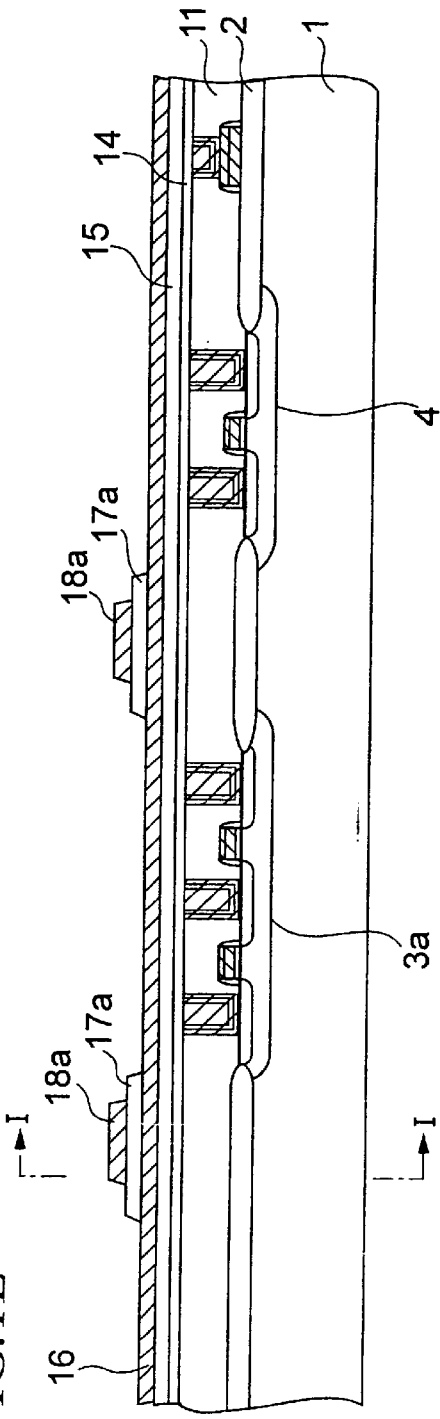

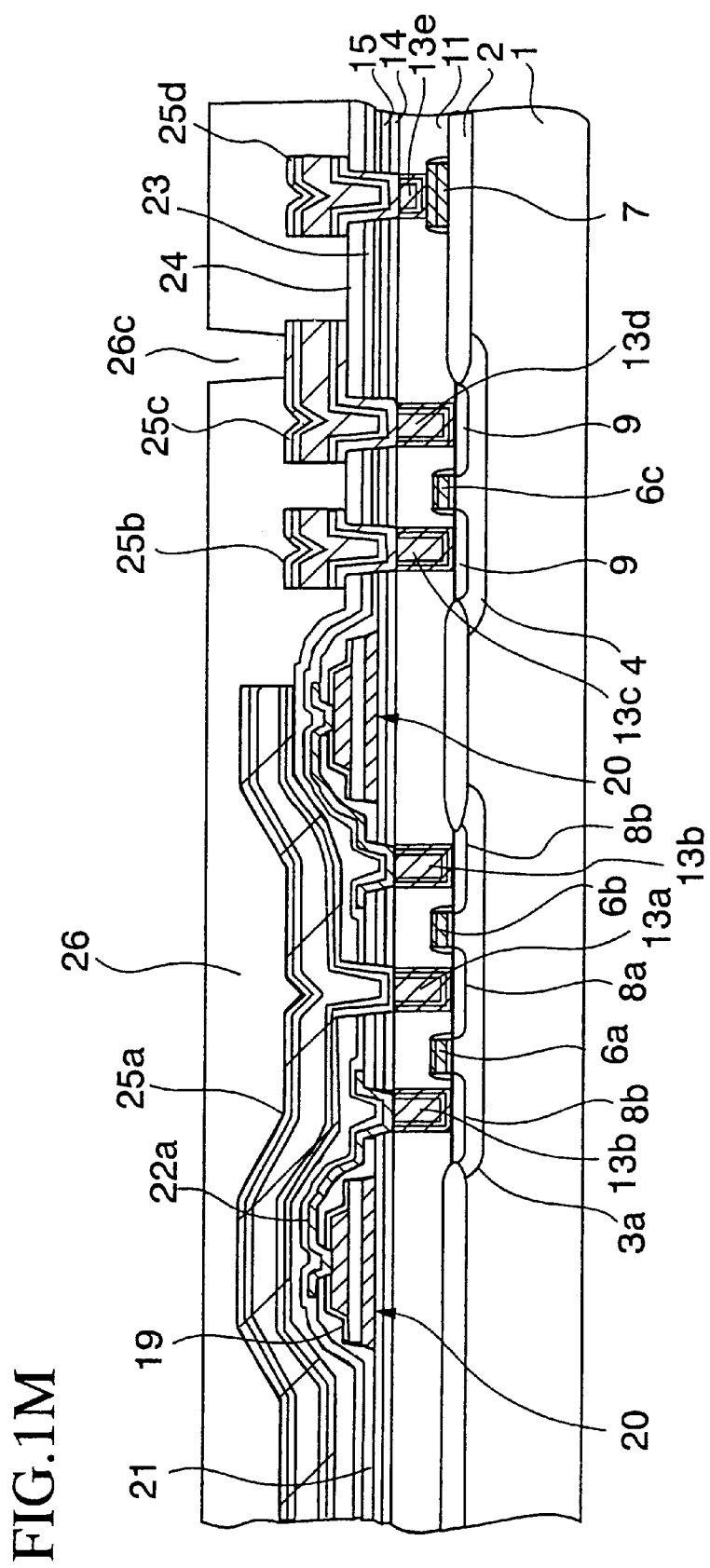

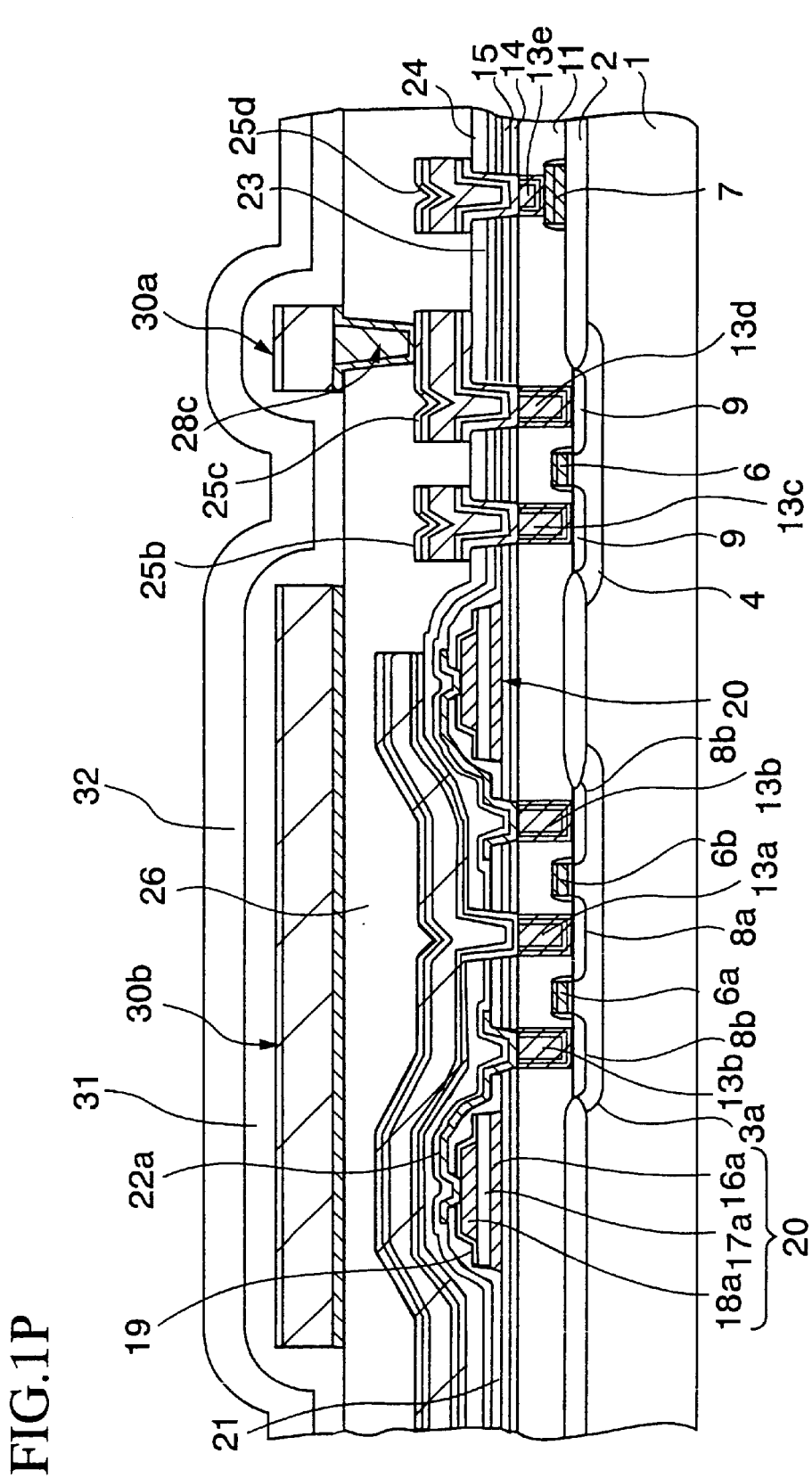

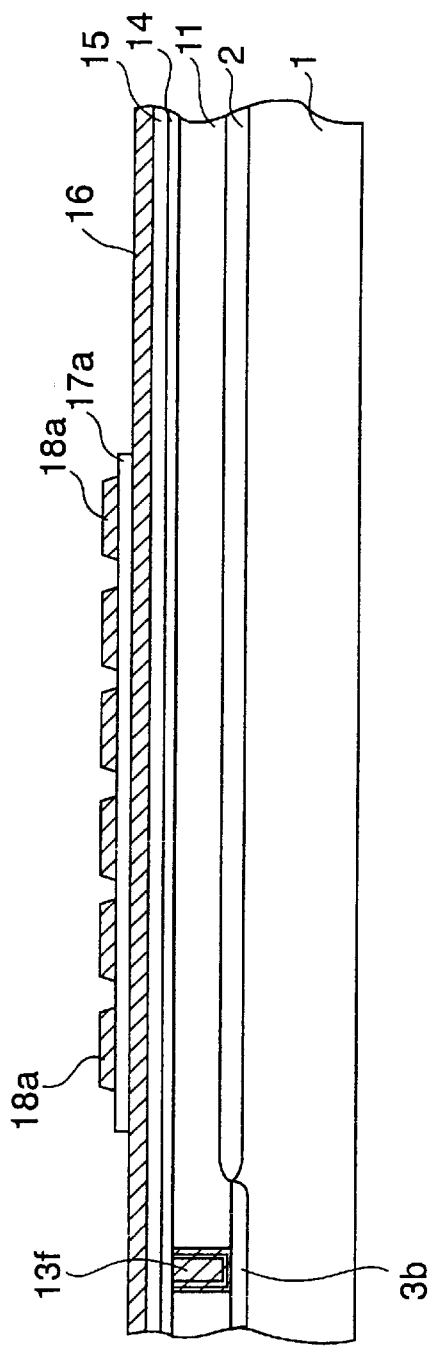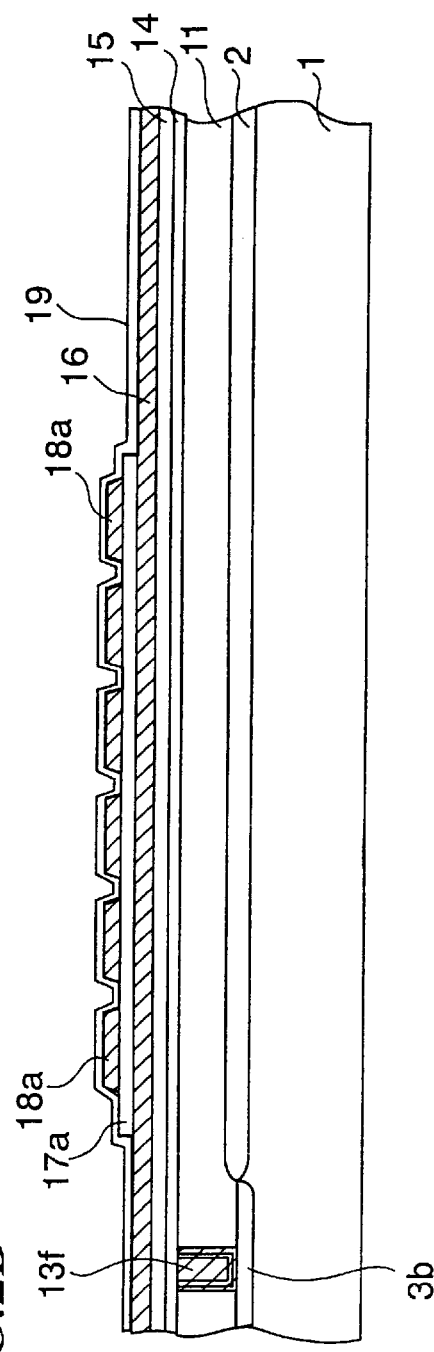

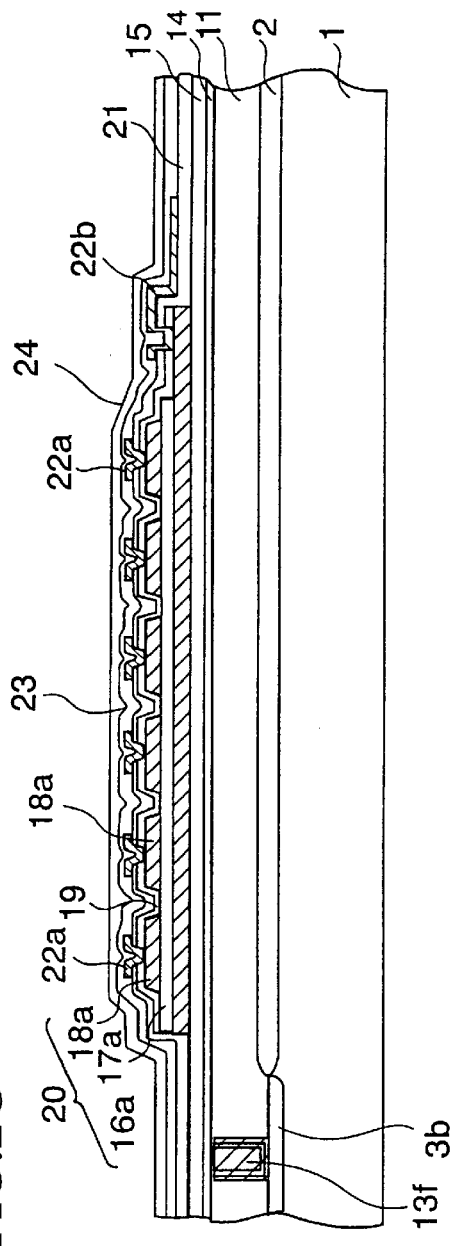
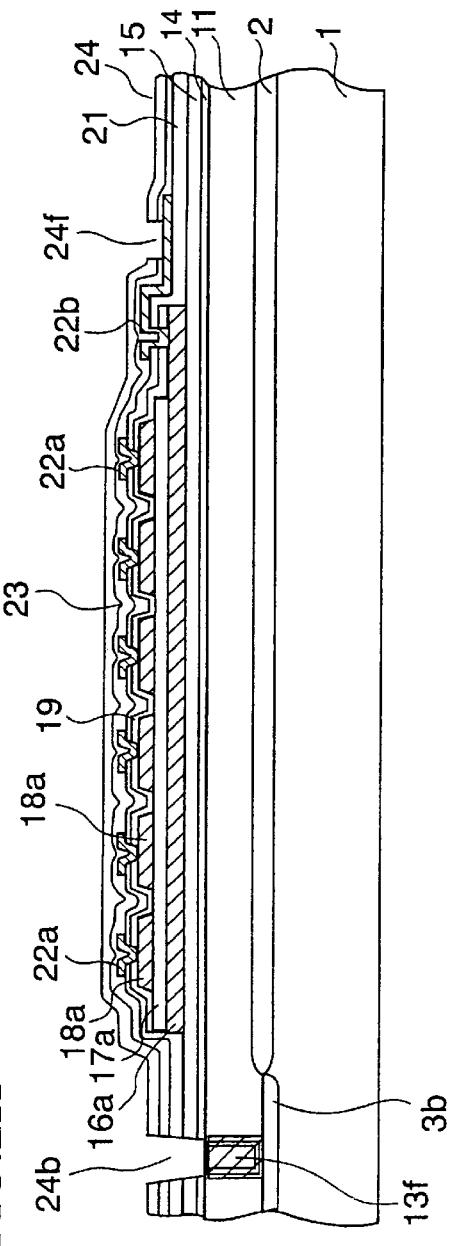

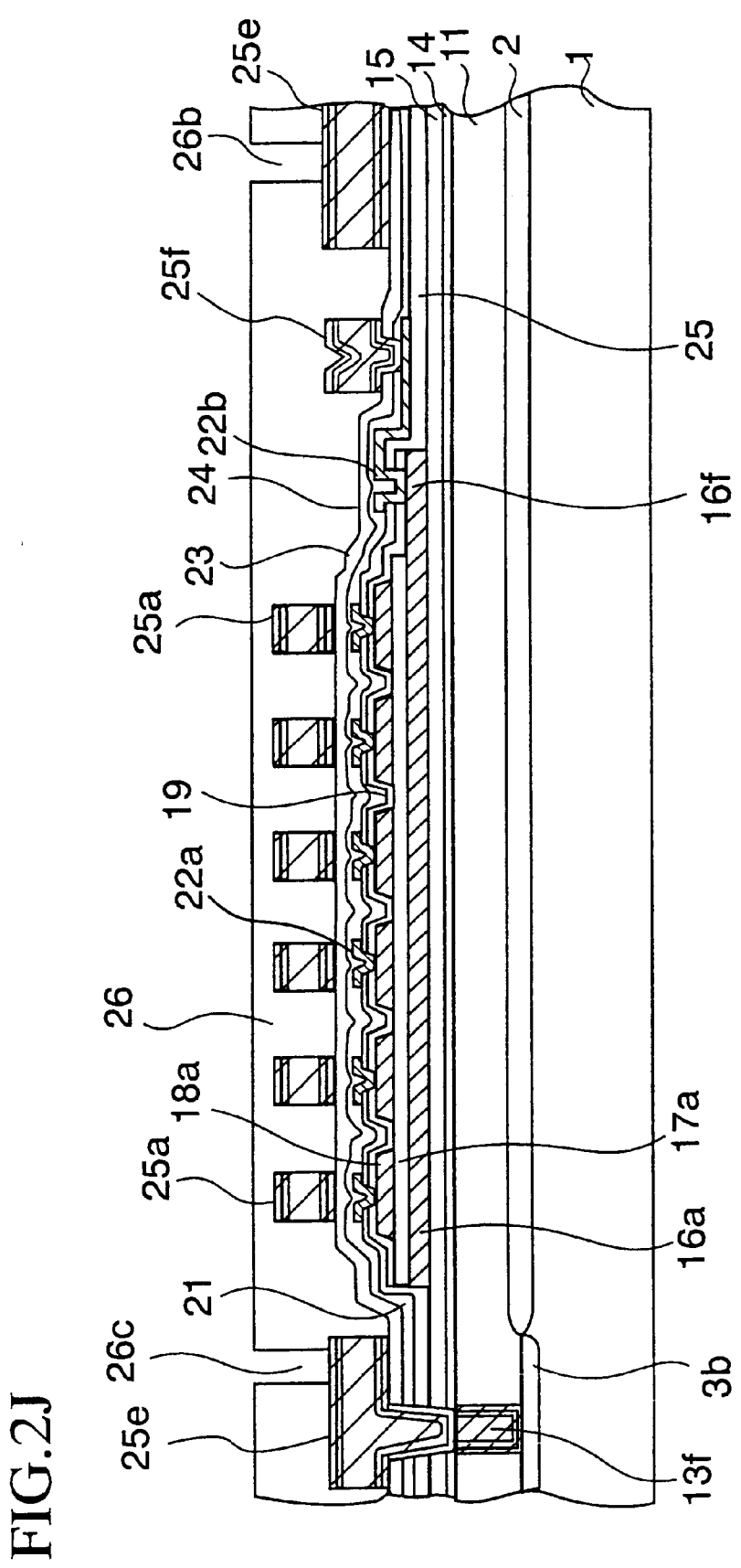

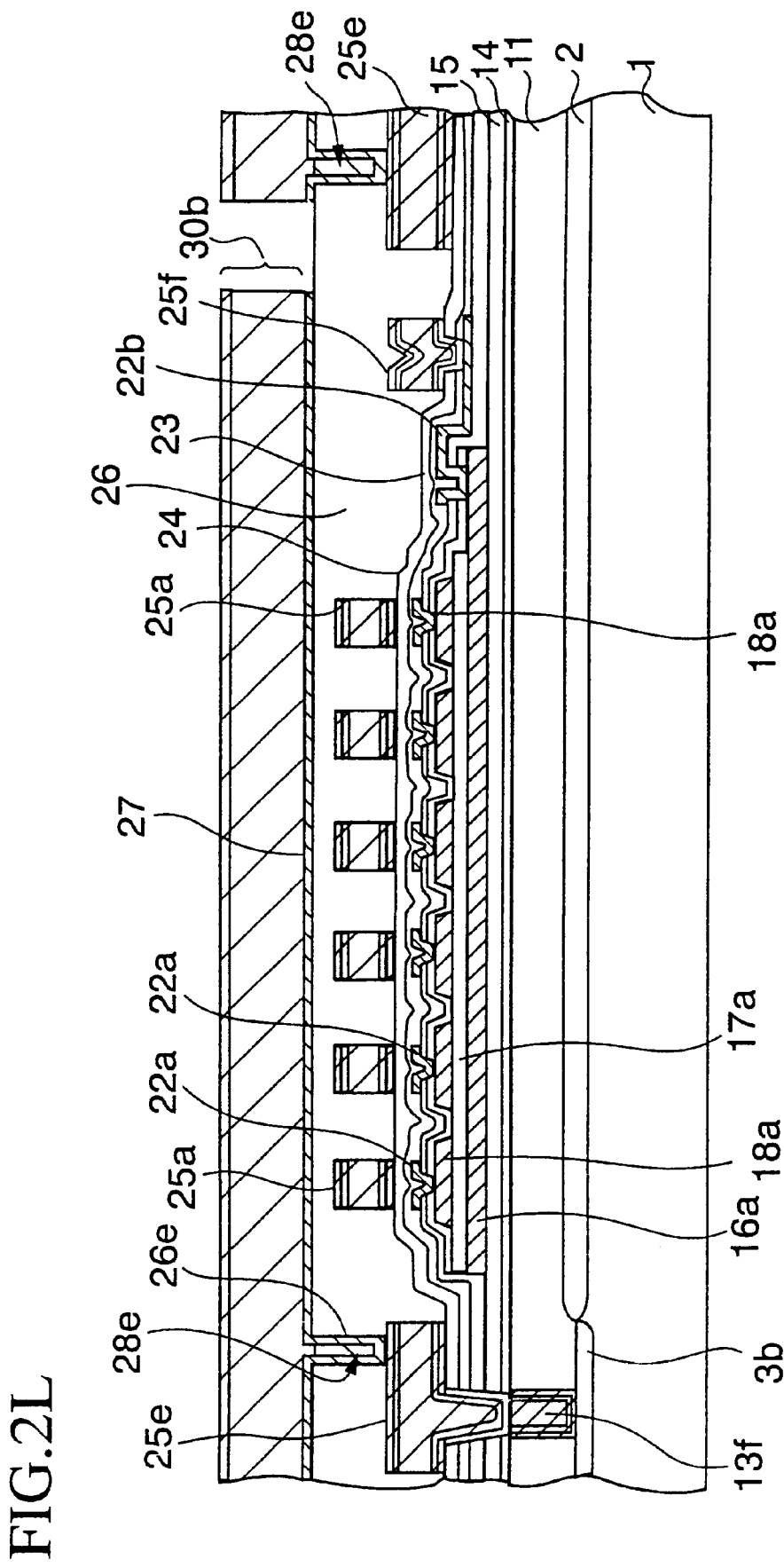

METHOD OF MANUFACTURING A SEMICONDUCTOR DEVICE WITH A HYDROGEN BARRIER LAYER

This application is a divisional of U.S. application Ser. No. 09/819,738 filed on March 29, 2001, now U.S. Pat. No. 6,570,203.

BACKGROUND OF THE INVENTION

1. Field of the Invention

The present invention relates to a semiconductor device and to a method of manufacturing the same and, more particularly, to a semiconductor device having a nonvolatile semiconductor memory (FeRAM: Ferroelectric Random Access Memory) using ferroelectric material as a dielectric film of a capacitor and a nonvolatile semiconductor memory (DRAM: Dynamic Random Access Memory) using high-dielectric material as the dielectric film of the capacitor, and to a method of manufacturing the same.

2. Description of the Prior Art

In the FeRAM, the multi-layered wiring technology used in other electronic devices is being employed to meet the demand for the higher integration of the device. However, since the ferroelectric material used in the FeRAM is exposed to the reducing atmosphere containing the hydrogen when the interlayer insulating film, the tungsten plug, the cover film, etc. are formed, the ferroelectric material is easily damaged by the formation of the multi-layered wiring structure.

In order to suppress the degradation of the ferroelectric film constituting the capacitor due to the reducing reaction, several trials were carried out.

For example, in FIG. 1 of Patent Application Publication (KOKAI) Hei 7-111318, it is set forth that, the protection film made of aluminum nitride which is formed above the upper electrode of the capacitor is possible to prevent the reduction of the ferroelectric film of the capacitor caused when the reducing gas permeates through the upper electrode. Also, in FIG. 8 of the same Publication, it is set forth that the protection film is formed on the wiring connected to the upper electrode of the capacitor and on the insulating film covering the capacitor. But no recitation about constituent material and the particular operation of the insulating film is given.

Also, in Patent Application Publication (KOKAI) Hei 9-97883, it is set forth that the lower electrode and the dielectric film constituting the capacitor are formed, then the dielectric film is covered with the insulating film, then the opening for exposing the dielectric film is formed in the insulating film, then the upper electrode of the capacitor is formed in the opening and on the insulating film, and then the protection film having the double-layered structure consisting of titanium and titanium nitride is formed on the upper electrode. This protection film has a function for preventing the diffusion of the hydrogen into the capacitor and the permeation of the moisture into the capacitor.

In FIG. 1 of Patent Application Publication (KOKAI) Hei 7-235639, it is set forth that the lower electrode and the dielectric film constituting the capacitor are formed, then the capacitor is covered with the insulating film, then the opening for exposing the upper electrode is formed in the insulating film, and then the wiring having the double-layered structure containing the titanium tungsten film is formed in the opening and on the insulating film. Also, in FIG. 2 of the same Publication, it is set forth that the water resisting layer made of silicon nitride is formed on the titan tungsten film over the capacitor except an area of the upper electrode of the capacitor. This water-resistant layer is formed to shut off the permeation of the moisture from the region on which the wiring is not formed.

Also, it is set forth on 17-th Ferroelectric Material Application Conference, Preprint, pp. 17–18 that the metal wiring connected to the capacitor is formed and then the alumina ($Al_2O_3$) film for covering the metal wiring is formed over the overall area of the substrate.

By the way, the structure in which the first level wiring is connected to the upper electrode of the capacitor is disclosed in above references, but it is not set forth to form further second and third level wirings above the capacitor.

Accordingly, since the capacitor is exposed further to the reducing atmosphere during the step of forming the multi-layered wiring above the capacitor, there is the possibility that the degradation of characteristics of the capacitor cannot be satisfactorily suppressed by the protection structure of the above capacitor in above references.

The degradation of the imprint characteristic becomes the greatest problem out of degradations of the ferroelectric capacitor due to the reducing atmosphere. The degradation of the imprint characteristic is such a problem that, if one signal (e.g., "1") is written into the ferroelectric capacitor, then the ferroelectric capacitor is left for a certain time as it is, and then an opposite signal (e.g., "0") is written into the capacitor, the opposite signal cannot be read out. In other words, the degradation of the imprint characteristic signifies such a situation that, since the signal in the one direction is imprinted into the capacitor, it is difficult to write the opposite signal into the capacitor.

In the 2-transisitors/2-capacitors type FeRAM, after the positive signal is written into one of two pair of ferroelectric capacitors and the negative signal is written into the other, a difference of the polarization charge between the two capacitors is set to Q.

Then, a difference of the polarization charge between the two ferroelectric capacitors obtained after the ferroelectric capacitors are baked at 150° C. for 88 hours is defined as $Q_{(88)}$ $\mu C/cm^2$, and a degradation rate of the difference Q between the capacitors obtained after an e time (e=natural logarithm) lapsed is defined as a "Q rate", both are used as indices of the imprint characteristic. In other words, it is understood that, as a value of $Q_{(88)}$ is increased larger and an absolute value of the Q rate is reduced smaller, the imprint characteristic becomes excellent much more.

Now the reason to evaluate the ferroelectric capacitor at 150° C. for 88 hours is to assure the 10-year use of the FeRAM under the circumstance of 55° C. Details are set forth in S. D.TRAYNOR, T. D.HADNAGY, and L. KAMMERDINER, Integrated Ferroelectrics, 1997, Vol.16, pp.63–76.

When the degradation of the characteristics of the capacitor due to difference in the wiring structure on the ferroelectric capacitor are evaluated based on the evaluation of the degradation of such ferroelectric capacitor, results shown in Table 1 were obtained by the present inventor's experiments.

TABLE 1

Imprint characteristic of the ferroelectric capacitor according to steps (5 V evaluation)

| steps | Q (88) [$\mu$C/cm$^2$] | Q rate [%] |
|---|---|---|
| After formation of the ferroelectric capacitor | 24.6 | −1.4 |
| After formation of the second layer metal wiring | 24.0 | −1.8 |
| After formation of the third layer metal wiring + the cover film | 19.2 | −5.0 |

In Table 1, the state that the first metal wiring is connected to the upper electrode of the ferroelectric capacitor is shown as "after formation of the ferroelectric capacitor". Also, the state that the second metal wiring is formed on the ferroelectric capacitor is shown as "after formation of the second layer metal wiring". In addition, the state that the third layer metal wiring and the cover film are formed on the ferroelectric capacitor is shown as "after formation of the third layer metal wiring+the cover film". The measurement of Q was carried out under the condition applying the voltage of 5 V to the ferroelectric capacitors.

According to Table 1, the Q rate is not so increased until the second layer metal is formed, and thus the degradation of the imprint characteristic is small. However, after the third layer metal wiring and the cover film are formed, the Q rate is increased and thus the degradation of the imprint characteristic appears.

The main causes of the degradation of the imprint characteristic are the CVD process applied to form the tungsten in the reducing atmosphere and the CVD process applied to form the cover film made of silicon nitride in the reduced atmosphere.

Accordingly, with the increase in the number of the wiring layer of the multi-layered wiring structure, the degradation of the imprint characteristic is also increased and thus the degradation of the capacitor characteristic is caused.

SUMMARY OF THE INVENTION

It is an object of the present invention to provide a semiconductor device having a structure that is capable of suppressing degradation of a ferroelectric or high-dielectric capacitor formed under a multi-layered structure, and a method of manufacturing the same.

According to the present invention, the semiconductor device has the first protection film which is covering the surface of the ferroelectric or high-dielectric capacitor, the second protection film formed to cover the capacitor through the first wiring formed above the capacitor, the second wiring formed over the second protection film, the third protection film formed to cover the capacitor over the second wiring, and the third protection film is set to the earth potential.

According to this, even when the insulating films and the conductive films are formed or etched over the ferroelectric or high-dielectric capacitors in the reducing atmosphere, the ferroelectric or high-dielectric films of the capacitors can be protected from the reducing atmosphere by the first protection film, the second protection film, and the third protection film underlying the films which are subjected to the forming or etching processes.

The second protection film or the third protection film can prevent the reducing gas over the second or third protection film from permeating in the ferroelectric or high-dielectric capacitor, but the second or third protection film cannot prevent the moisture or the hydrogen existing under the second or third protection film from entering into the capacitor.

Therefore, in order to prevent the reduction of the ferroelectric or high-dielectric capacitors, either a combination of the first protection film and the second protection film or a combination of the first protection film and the third protection film is indispensable. When all the first protection film, the second protection film, and the third protection film are provided, the reduction of the ferroelectric or high-dielectric capacitors can be excellently prevented. Then, these protection films improve the imprint characteristic of the ferroelectric capacitor satisfactorily and also improve the retention performance peculiar to the FeRAM.

Also, as the third protection film is set to the earth potential, the mutual induction between the second wirings under the third protection film, e.g., the bit lines, under the third protection film is prevented and also the fluctuation of the electlic potential of the second wirings can be suppressed, whereby the performance of FeRAM or DRAM can be improved. In addition, the third protection film that is set to the earth potential prevents the hydrogen ion over the third protection film from permeating into the ferroelectric capacitors. The hydrogen ion is generated when one film is growing over the third protection film.

In case the first protection film and the second protection film are formed of alumina, the imprint characteristic of the ferroelectric capacitors can be improved if the thickness is set to 15 to 100 nm or the helicon sputter method is employed.

BRIEF DESCRIPTION OF THE DRAWINGS

FIGS. 2A to 2M are sectional views showing steps of manufacturing a semiconductor device according to the embodiment of the present invention, taken along the extending direction of the word line;

DESCRIPTION OF THE PREFERRED EMBODIMENTS

Embodiments of the present invention will be explained with reference to the accompanying drawings hereinafter.

FIG. 1A to FIG. 1P are sectional views showing steps of manufacturing a semiconductor device according to an embodiment of the present invention, taken along the extending direction of the bit line. FIG. 2A to FIG. 2M are sectional views showing steps of manufacturing a capacitor and its peripheral structure, taken along the extending direction of the word line of the semiconductor device according to the embodiment of the present invention.

Figure 1B:
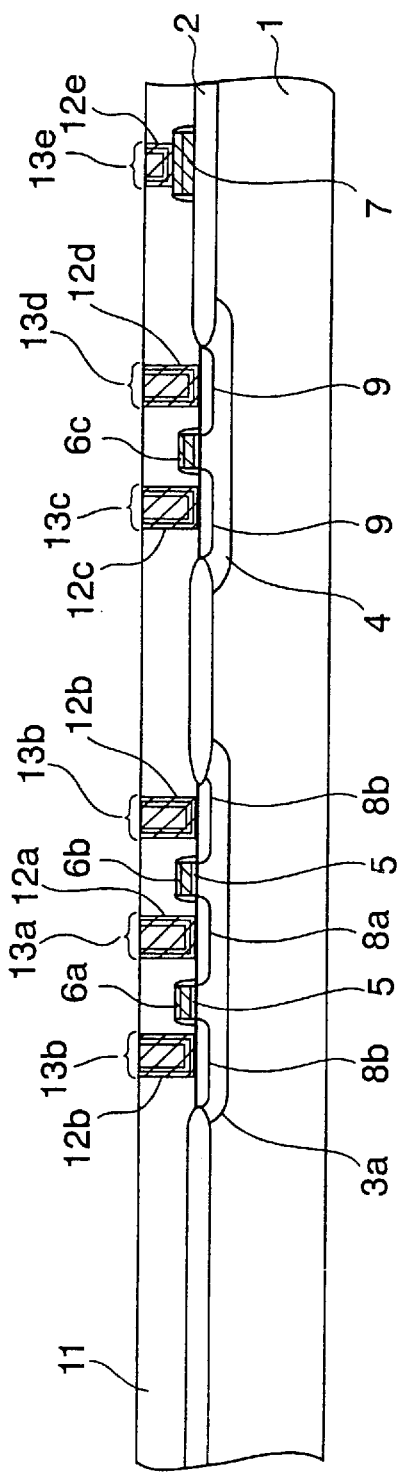
FIGS. 1A to 1P are sectional views showing steps of manufacturing a semiconductor device according to an embodiment of the present invention, taken along the extending direction of the bit line.
Figure 2A:
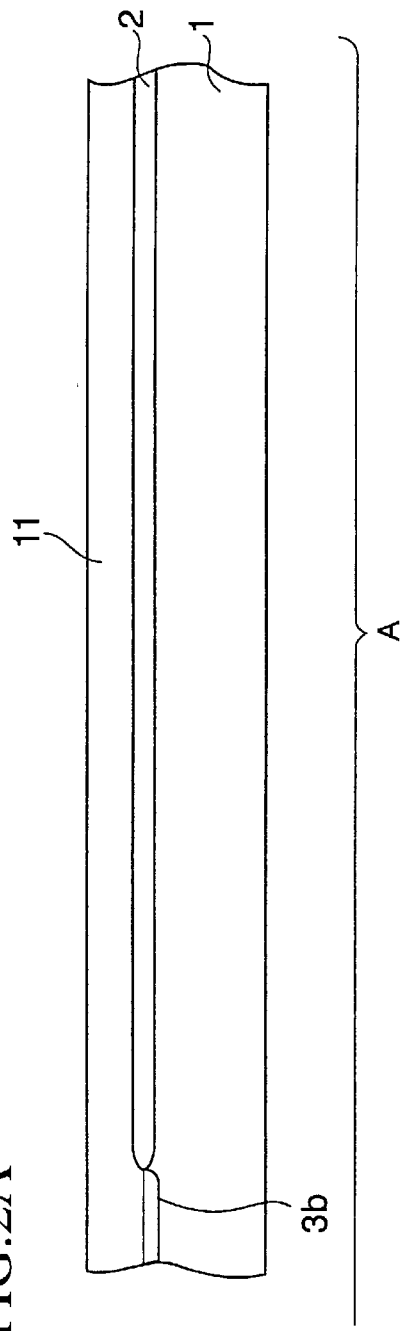

First, steps required to get a sectional structure shown in FIG. 1A and FIG. 2A will be explained hereunder.

In FIG. 1A, a device isolation insulating film 2 is formed on a surface of a p-type silicon (semiconductor) substrate 1 by the LOCOS (Local Oxidation of Silicon) method. In this case, in addition to the silicon oxide film formed by the LOCOS method, the STI (Shallow Trench Isolation) may be employed as the device isolation insulating film 2.

After such device isolation insulating film 2 is formed, a p-type impurity and an n-type impurity are selectively introduced into predetermined active regions (transistor forming regions) in a memory cell region A and a peripheral circuit region B of the silicon substrate 1 respectively, whereby a first p-well 3a is formed in the active region of the memory cell region A and also an n-well 4 is formed in the active region of the peripheral circuit region B. Also, as shown in FIG. 2A, a second p-well 3b is formed in vicinity of the region of the memory cell region A, in which the capacitor is formed.

Although not shown in FIG. 1A, a p-well (not shown) is formed in the peripheral circuit region B to form the CMOS.

Then, a silicon oxide film used as a gate insulating film 5 is formed by thermally oxidizing surfaces of respective active regions of the silicon substrate 1.

Then, an amorphous silicon film and a tungsten silicide film are formed in sequence on the overall surface of the silicon substrate 1 to cover the device isolation insulating film 2 and the gate insulating film 5. Then, the amorphous silicon film and the tungsten silicide film are patterned into predetermined shapes by the photolithography method, whereby gate electrodes 6a to 6c are formed in the active regions and also a leading wiring 7 is formed on the device isolation insulating film 2.

In the memory cell region A, two gate electrodes 6a, 6b are arranged on the first p-well 3a in almost parallel with each other. These gate electrodes 6a, 6b are extended on the device isolation insulating film 2 and act as the word lines WL.

In this case, a polysilicon film may be formed in place of the amorphous silicon film constituting the gate electrodes 6a to 6c.

Then, n-type impurity diffusion regions 8a, 8b serving as source/drain of an n-channel MOS transistor are formed by ion-implanting the n-type impurity into the first p-well 3a on both sides of the gate electrodes 6a, 6b in the memory cell region A. At the same time, n-type impurity diffusion regions are formed in a p-well (not shown) in the peripheral circuit region B.

Next, p-type impurity diffusion regions 9 serving as source/drain of a p-channel MOS transistor are formed by ion-implanting the p-type impurity into the n-well 4 on both sides of the gate electrode 6c in the peripheral circuit region B. The n-type impurity and the p-type impurity are ion-implanted separately by using the resist patterns.

Then, an insulating film is formed on the overall surface of the silicon substrate 1. Sidewall insulating films 10 are left on both side portions of the gate electrodes 6a to 6c and the leading wiring 7 respectively by etching back the insulating film. The silicon oxide (SiO2) formed by the CVD method, for example, is used as the insulating film.

Next, a silicon oxide nitride (SiON) film (not shown) as a cover film may be formed on the overall surface of the silicon substrate 1 by the plasma CVD method.

Then, a silicon oxide (SiO2) film is grown up to about 1.0 μm thickness by the plasma CVD method using the TEOS gas. This silicon oxide film is used as a first interlayer insulating film 11.

Then, as the densifying process of the first interlayer insulating film 11, such first interlayer insulating film 11 is annealed at the temperature of 700° C. for 30 minutes at the atmospheric pressure in the nitrogen atmosphere. Then, an upper surface of the first interlayer insulating film 11 is planarized by polishing the first interlayer insulating film 11 by virtue of the CMP (Chemical Mechanical Polishing) method.

Figure 2B:
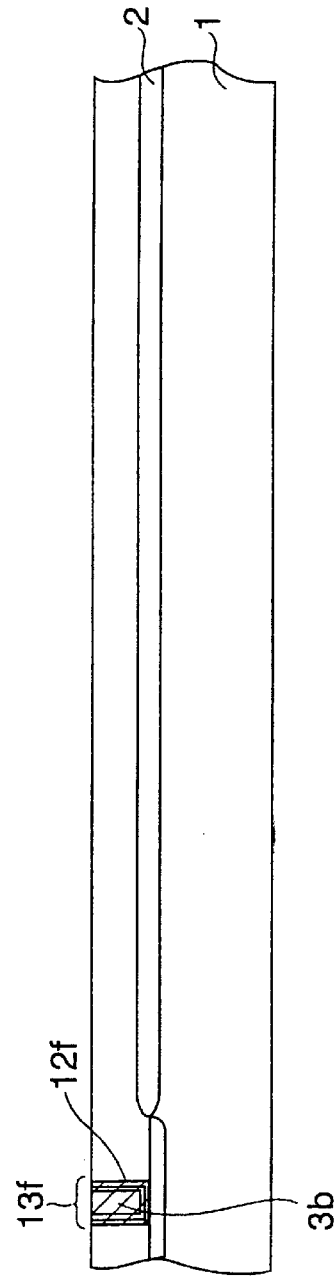

Then, steps required to form a sectional structure shown in FIG. 1B and FIG. 2B will be explained hereunder.

First, holes 12a to 12d reaching the impurity diffusion regions 8a, 8b, 9, a hole 12e reaching the leading wiring 7, and a hole 12f reaching the second well 3b are formed by patterning the first interlayer insulating film 11 by virtue of the photolithography method. Then, a Ti, (titanium) film of 20 nm thickness and a TiN (titanium nitride) film of 50 nm thickness are formed in sequence on the first interlayer insulating film 11 and in the holes 12a to 12f by the sputter method. Then, a W (tungsten) film is grown on the TiN film by the CVD method to have a thickness that can perfectly bury the holes 12a to 12f.

Then, the W film, the TiN film, and the Ti film are polished sequentially by the CMP method until the upper surface of the first interlayer insulating film 11 is exposed. After this polishing, the W film, etc. left in the holes 12a to 12f are used as contact plugs 13a to 13f.

The first contact plug 13a on the n-type impurity diffusion region 8a put between two gate electrodes 6a, 6b is connected to the bit line, described later, in the first p-well 3a of the memory cell region A. In addition, two second contact plugs 13b are connected to the upper electrode of the capacitor, described later.

In this case, for the sake of the contact compensation, the impurity may be ion-implanted into the impurity diffusion regions 8a, 8b, 9 after the holes 12a to 12f are formed.

Figure 1C:
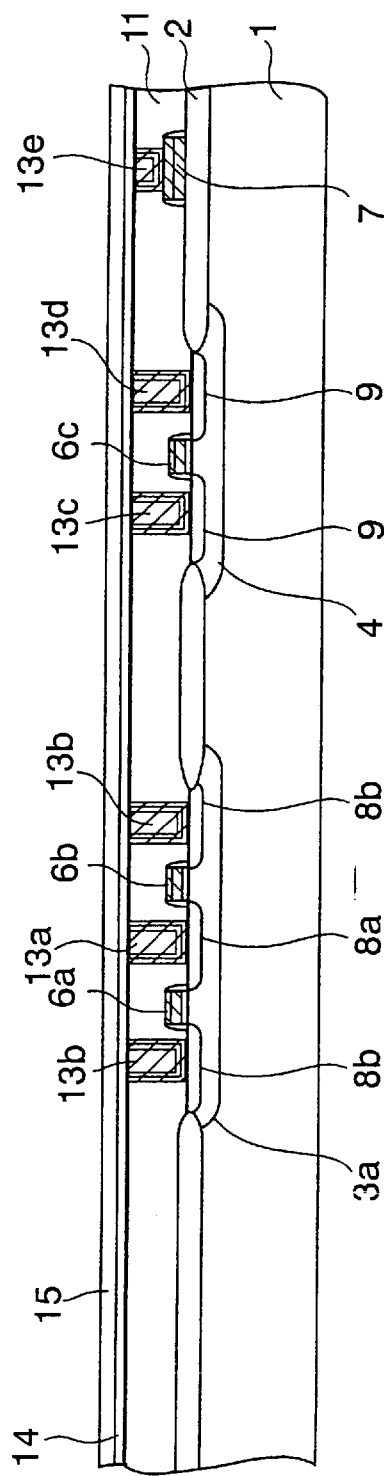

Then, as shown in FIG. 1C, in order to prevent the oxidation of the contact plugs 13a to 13f, an SiON film 14 of 100 nm thickness is formed on the first interlayer insulating film 11 and the contact plugs 13a to 13f by the plasma CVD method using silane ($SiH_4$). In addition, an $SiO_2$ film 15 of 150 nm thickness is formed on the SiON film 14 by the plasma CVD method using TEOS and the oxygen as the reaction gas. The SiON film 14 has a function for preventing entering of the moisture into the first interlayer insulating film 11.

Then, in order to densify the SiON film 14 and the $SiO_2$ film 15, these films are annealed at the temperature of 650° C. for 30 minutes at the atmospheric pressure in the nitrogen atmosphere.

Then, as shown in FIG. 1D, a Ti layer and a Pt (platinum) layer on the $SiO_2$ film 15 are formed in sequence to form a first conductive film 16 having a double-layered structure. The Ti layer and the Pt (platinum) layer are formed by the DC sputter method. In this case, a thickness of the Ti layer is set to about 10 to 30 nm, and a thickness of the Pt layer is set to about 100 to 300 nm. For example, the thickness of the Ti layer is set to 20 nm, and the thickness of the Pt layer is set to 175 nm. In this case, a film made of iridium, ruthenium, ruthenium oxide, iridium oxide, strontium ruthenium oxide ($SrRuO_3$), or the like may be formed as a first conductive film 16.

Then, a lead zirconate titanate (PZT: $Pb(Zr_{1-x}Ti_x)O_3$) film serving as a ferroelectric film 17 is formed on the first conductive film 16 by the RF sputter method to have a thickness of 100 to 300 nm, e.g. 200 nm.

Then, as the crystallizing process of PZT constituting the ferroelectric film 17, RTA (Rapid Thermal Annealing) is carried out at the temperature of 650 to 850° C. for 30 to 120 seconds in the oxygen atmosphere. For example, PZT is annealed at the temperature of 700° C. for 60 seconds.

As the method of forming ferroelectric material, in addition to the above sputter method, there are the spin-on method, the sol-gel method, the MOD (Metal Organic Deposition) method, and the MOCVD method. Also, as the ferroelectric material, in addition to PZT, there are oxides such as the lead lanthanum zirconate titanate (PLZT), $SrBi_2(Ta_xNb_{1-x})_2O_9$ (where 0<x<1), $Bi_4Ti_2O_{12}$, etc. In case DRAM is formed instead of the FeRAM, the high-dielectric material such as $(BaSr)TiO_3$ (BST), strontium titanate (STO), or the like may be employed in place of the above ferroelectric material Then, an iridium oxide ($IrO_2$) film as a second conductive film 18 is formed on the ferroelectric film 17 by the sputter method to have a thickness of 100 to 300 nm. For example, the thickness of the second conductive film 18 is set to 200 nm. In this case, as the second conductive film 18, platinum or strontium ruthenium oxide (SRO) may be employed.

Then, steps required to form a sectional structure shown in FIG. 1E and FIG. 2C will be explained hereunder.

First, upper electrodes 18a of a plurality of capacitors, which are arranged in a matrix fashion along the extending direction of the word lines WL and the extending direction of the bit lines, described later, are formed by patterning the second conductive film 18. The upper electrodes 18a are formed in vicinity of the p-well 3a as many as the MOS transistors formed in the memory cell region A. FIG. 2C shows a sectional shape taken along a I—I line in FIG. 1E.

Then, stripe-like dielectric films 17a of the capacitors, which are connected in the direction of the word lines WL under a plurality of upper electrodes 18a, are formed by patterning the ferroelectric film 17.

The silicon substrate 1 is placed in the oxygen atmosphere, and then the oxygen preprocess annealing is applied by annealing the substrate 1 at the substrate temperature of 350° C. for 60 minutes.

Figure 1F:
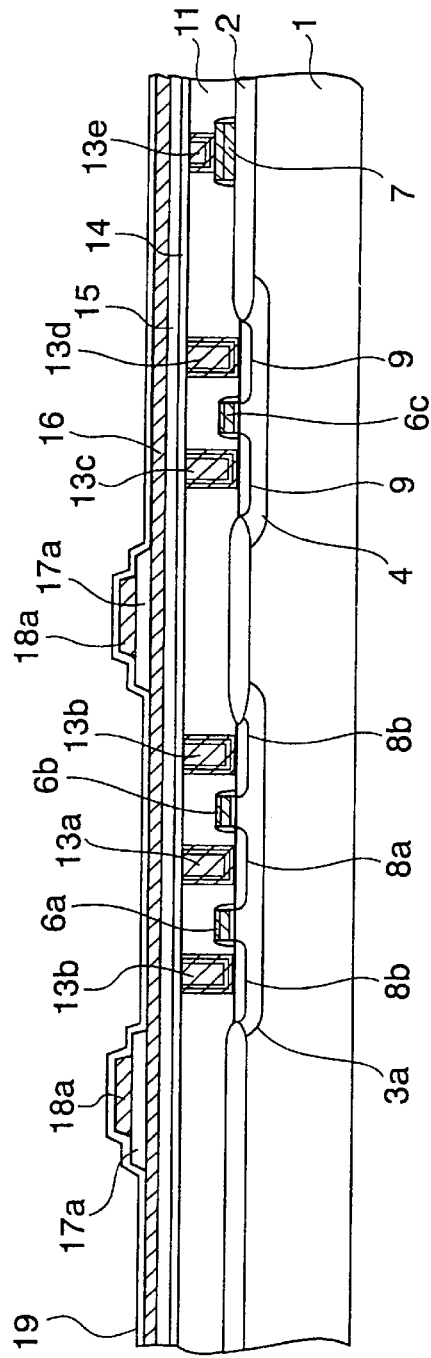

Then, as shown in FIG. 1F and FIG. 2D, a first protection film 19 made of alumina of 20 to 100 nm thickness, e.g., 50 nm thickness is formed on the upper electrodes 18a, the dielectric films 17a, and the first conductive film. 16 by employing the RF sputter equipment. This alumina is formed by setting the RF power to 2 kW at the atmospheric pressure of 7.5 mTorr. In turn, the silicon substrate 1 is placed in the oxygen atmosphere, and then the oxygen process annealing is applied by annealing the substrate 1 at the substrate temperature of 700° C. for 60 minutes.

Figure 1G:
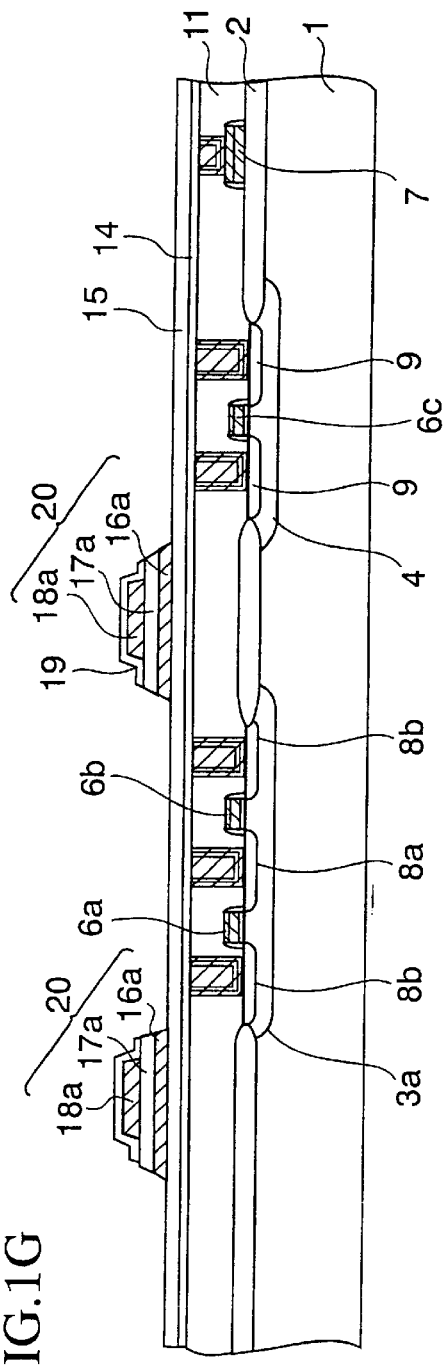
Figure 2E:
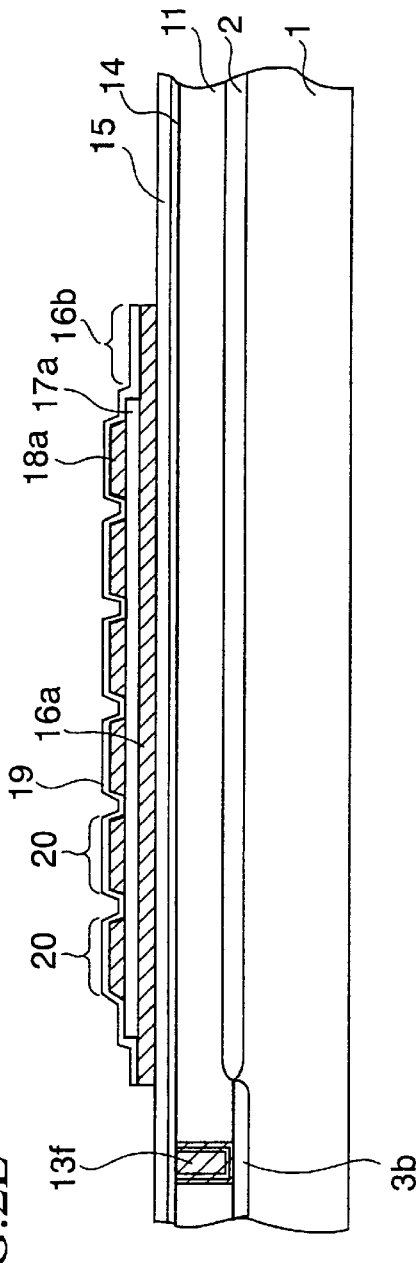

Then, stripe-like resist patterns (not shown) for covering the dielectric films 17a and the upper electrodes 18a in the direction of the word lines WL are formed on the first protection film 19. Then, the first protection film 19 and the first conductive film 16 are etched in sequence by using the resist patterns as a mask. Accordingly, as shown in FIG. 1G and FIG. 2E, lower electrodes 16a of the capacitor, which are commonly used as wirings passing under a plurality of dielectric films 17a, are formed of the stripe-like first conductive film 16.

Each of the lower electrodes 16a has a contact region 16b that is not covered by the stripe-like dielectric film 17a. Also, the first protection film 19 has a shape to cover the upper electrode 18a, the dielectric film 17a, and the lower electrode 16a. The silicon substrate 1 is placed in the oxygen atmosphere after the lower electrodes 16a are patterned, and then the process for improving the film quality of the ferroelectric film 17 is carried out at the substrate temperature of 650° C. for 60 minutes.

The lower electrode 16a, the dielectric film 17a, and the upper electrode 18a formed by above steps constitute a ferroelectric capacitor 20. In the memory cell region A, the ferroelectric capacitors 20 are formed in the same number as the MOS transistors.

Figure 1H:
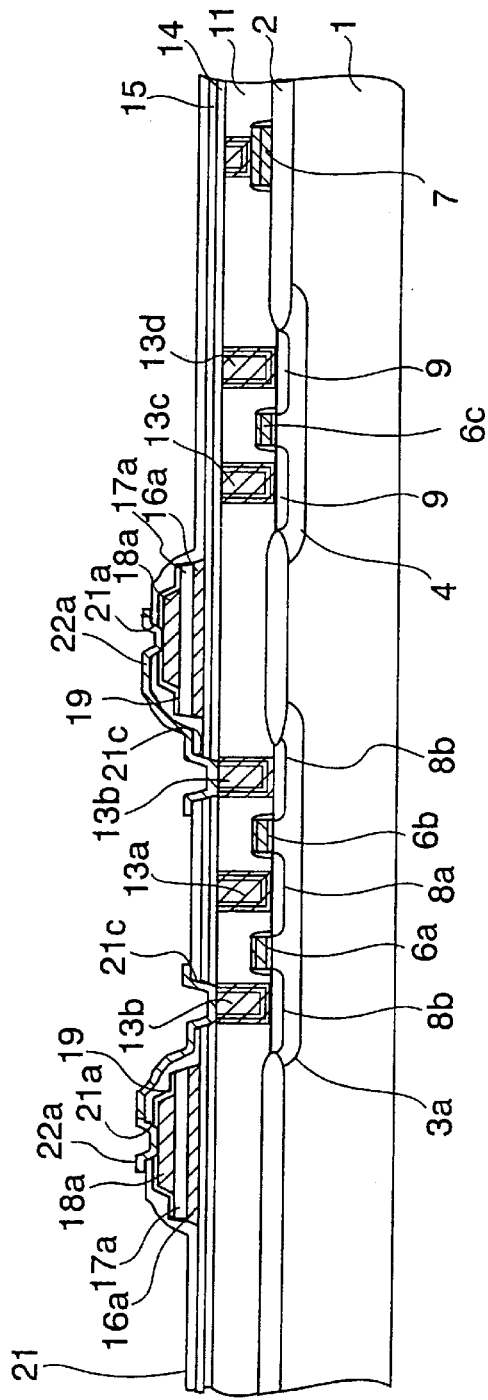
Figure 2F:
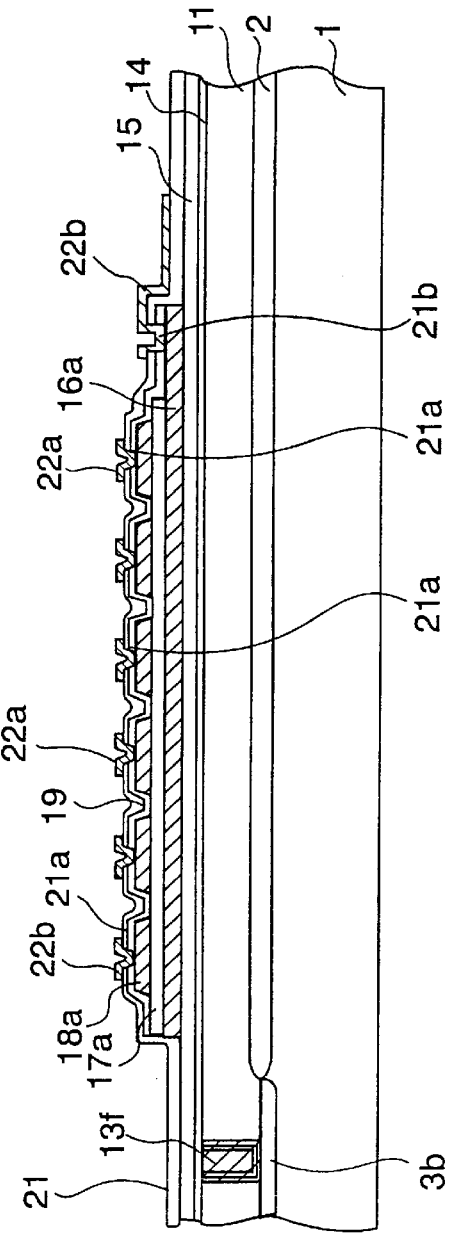

Then, steps required to form a sectional structure shown in FIG. 1H and FIG. 2F will be explained hereunder.

First, a second interlayer insulating film 21 of $SiO_2$ is formed on the overall surface to cover the ferroelectric capacitors 20. The second interlayer insulating film 21 is formed by the steps of forming an $SiO_2$ film of 480 nm by a plasma-CVD using TEOS, forming an SOG (Spin-On-Glass) film of 100 nm, and then etching back 300 nm these films in depth.

Then, the second interlayer insulating film 21 and the first protection film 19 are patterned by the photolithography method. Thus, contact holes 21a are formed on the upper electrodes 18a of the ferroelectric capacitors 20 and also contact holes 21b are formed on the contact regions 16b of the lower electrodes 16a, as shown in FIG. 2F.

Then, the second interlayer insulating film 21, the SiON film 14, and the $SiO_2$ film 15 are patterned by the photolithography method, whereby contact holes 21c are formed on the second contact plugs 13b formed near both ends of the first p-well 3a in the memory cell region A.

Then, a TiN film of 125 nm thickness, for example, is formed on the second interlayer insulating film 21 and in the contact holes 21a to 21c by the sputter method. Then, the TiN film is patterned by the photolithography method. Thus, as shown in FIG. 1H, in the memory cell region A, first local wirings 22a, that electrically connect the second contact plugs 13b formed near both ends of the first p-well 3a and the upper electrodes 18a via the contact holes 21a, 21c, are formed and also second local wirings 22b, that are extended to peripheries of the lower electrodes 16a via the contact holes 21b formed on the contact regions 16b of the lower electrodes 16a are formed.

The first and second local wirings 22a, 22b are the first layer metal wirings.

Figure 1I:
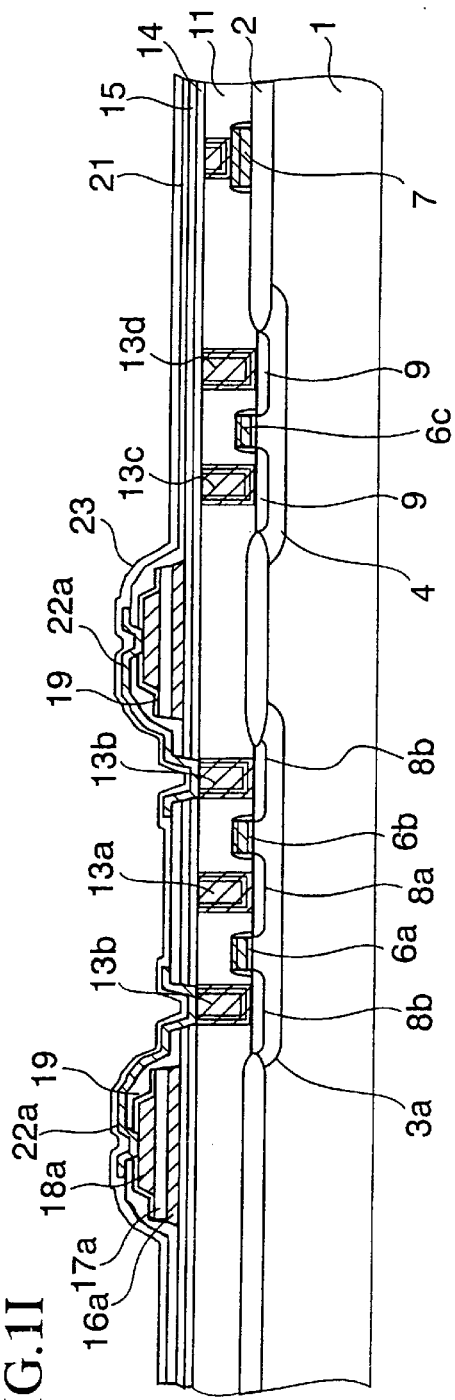

Then, as shown in FIG. 1I, a second insulating protection film 23 made of alumina for covering entire surfaces of the first and second local wirings 22a, 22b and the second interlayer insulating film 21 is formed to have a thickness of 15 to 100 nm. If the film thickness of the second insulating protection film 23 becomes thicker, the imprint rate of the ferroelectric capacitor 20 can be improved. However, it becomes difficult to execute the etching containing the postprocessing when contact holes for connecting the second layer metal wirings, described later, and the substrate are formed in the second insulating protection film 23. In this case, it is preferable that a film thickness of the second protection film 23 should be set to about 20 nm.

The second protection film 23 may be patterned by the photolithography method such that it has a shape for covering at least the upper electrodes 18a, a shape for covering only the ferroelectric capacitor 20, a shape for covering the overall region of the memory cell region A, or a shape for not-covering the peripheral circuit region B.

Figure 1J:
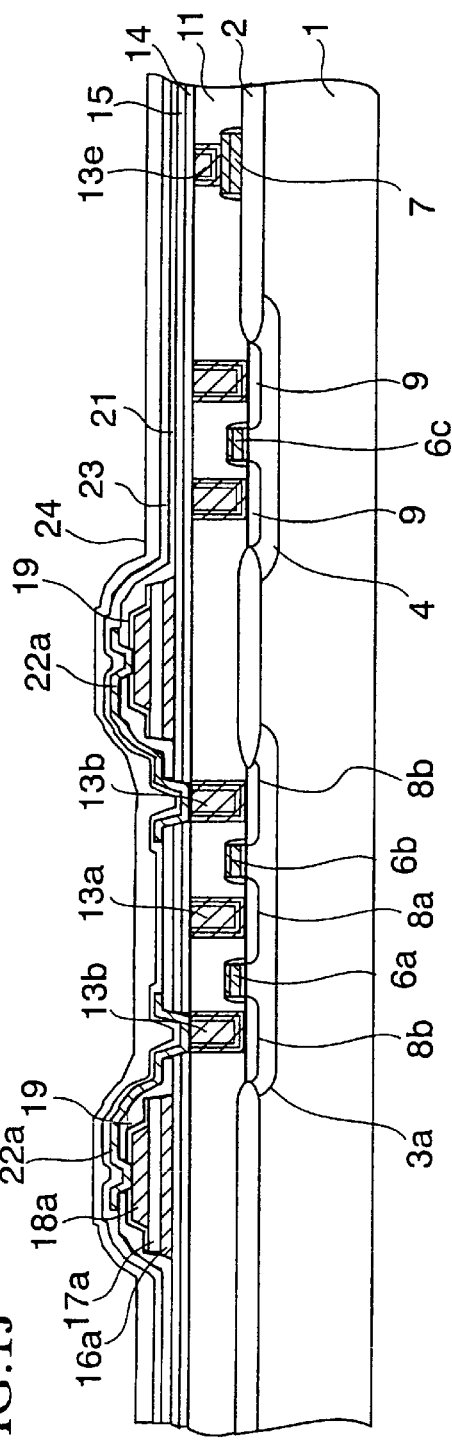

Then, as shown in FIG. 1J and FIG. 2G, a third interlayer insulating film 24 made of $SiO_2$ is formed on the second protection film 23 by the plasma CVD method using the TEOS to have a thickness of 200 to 400 nm. Then, the dehydration process is carried out by annealing the third interlayer insulating film 24 at 350° C. in the plasma atmosphere using the $N_2O$ gas.

Figure 1K:
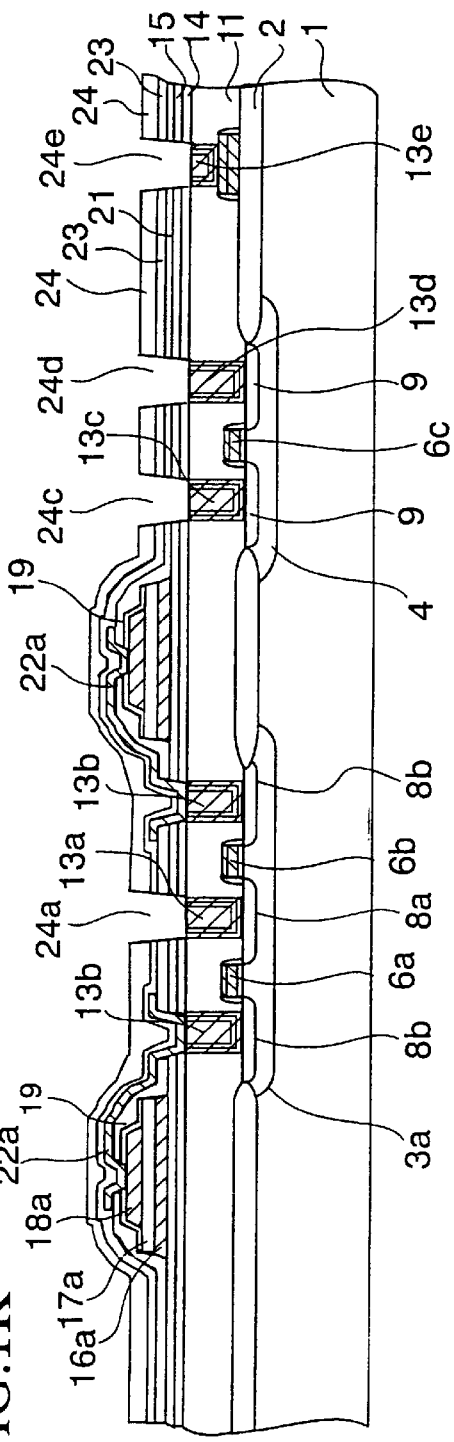

Then, respective films from the third interlayer insulating film 24 to the SiON film 14 are patterned in the memory cell region A by the photolithography method employing the resist pattern (not shown). Accordingly, as shown in FIG. 1K, a hole 24a is formed on the first contact plug 13a located at the center position of the first p-well 3a, and also, as shown in FIG. 2H, a hole 24b is formed on the second contact plugs 13b located on the second p-well 3b. At the same time, holes 24c to 24e are formed on respective contact plugs 13c to 13e in the peripheral circuit region B. In this case, as shown in FIG. 2H, a hole 24f is formed on the second local wiring 22b extended from the lower electrode 16a of the ferroelectric capacitor 20 to the outside.

The holes 24a to 24f formed in the third interlayer insulating film 24 and the underlying films are formed by the step etching using the same dry etching equipment.

For example, the third interlayer insulating film 24 is etched under the conditions that the pressure in the etching atmosphere is set to 350 mTorr by introducing Ar, $CF_4$, and $C_4F_8$ into the atmosphere at 618 sccm, 67 sccm, and 32 sccm respectively, the RF power is set to 1 kW, and the etching time is set to 26 seconds. The second protection film 23 is etched under the conditions that the pressure in the etching atmosphere is set to 1000 mTorr by introducing Ar, $CHF_3$, and $CF_4$ into the atmosphere at 596 sccm, 16 sccm, and 24 sccm respectively, the RF power is set to 900 W, and the etching time is set to 22 seconds. In addition, the second interlayer insulating film 21, the SiON film 14, and the $SiO_2$ film 15 are etched under the conditions that the pressure in the etching atmosphere is set to 350 mTorr by introducing Ar, $CF_4$, and $C_4F_8$ into the atmosphere at 618 sccm, 67 sccm, and 32 sccm respectively, the RF power is set to 1 kW, and the etching time is set to 60 seconds.

Since the second local wiring 22b formed of TiN shown in FIG. 2H acts as the etching stopper in such etchings, the hole 24f formed on the wiring 22b becomes shallower than remaining holes 24a to 24e.

Then, a metal film having a quintuple-layered structure, that consists of a Ti film of 20 nm thickness, a TiN film of 50 nm thickness, an Al—Cu film of 600 nm thickness, a Ti film of 5 nm thickness, and a TiN film of 150 nm thickness in order of low level, is formed on the third interlayer insulating film 24 and in the holes 24a to 24f, and then this metal film is patterned by the photolithography method.

Figure 1L:
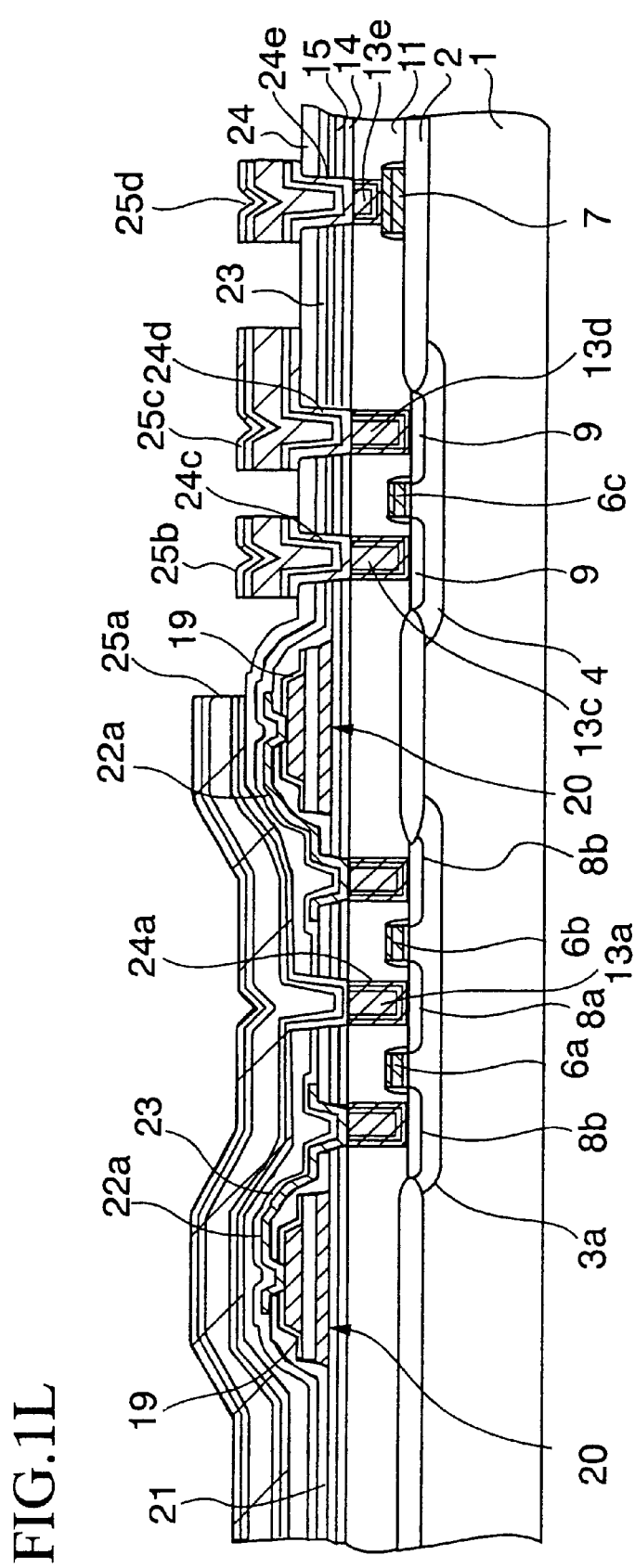
Figure 2I:
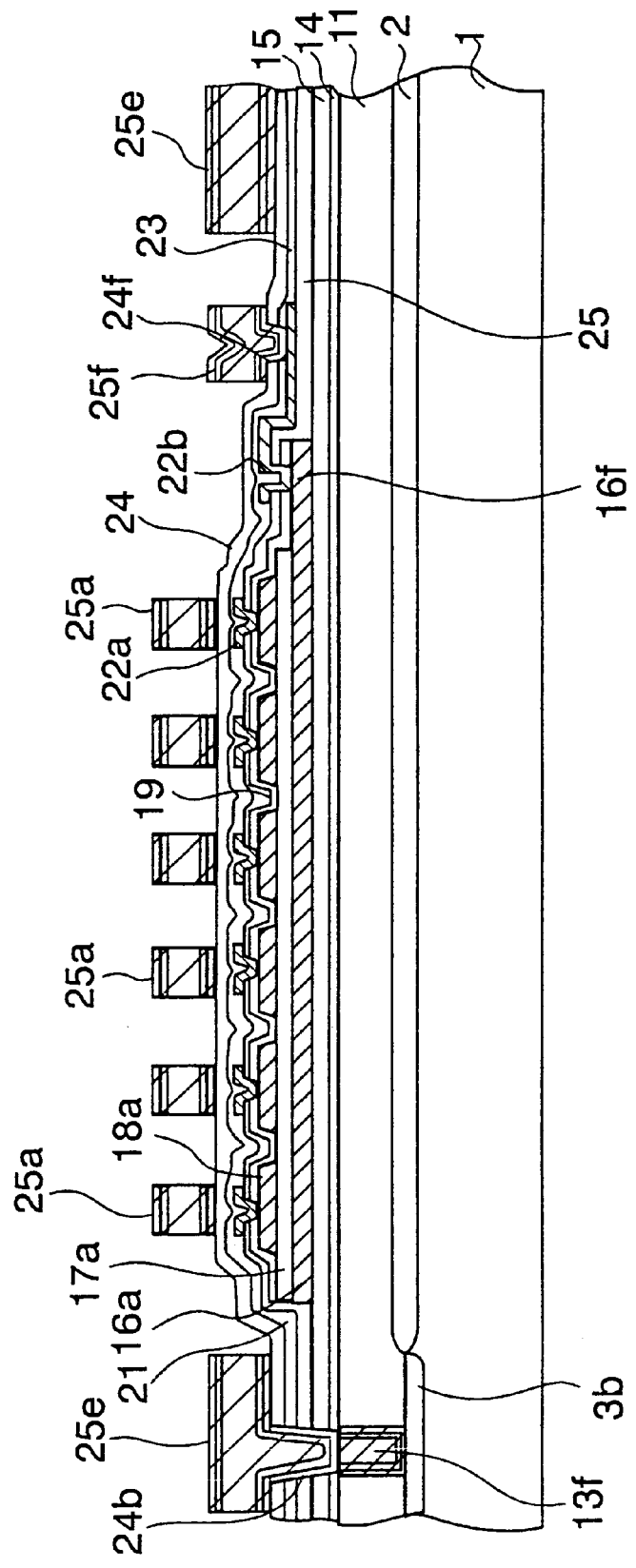

Accordingly, as shown in FIG. 1L, a bit line 25a is formed in the memory cell region A, and also wirings 25b to 25d are formed in the peripheral circuit region B. The bit line 25a in the memory cell region A is connected to the first contact plug 13a on the first p-well 3a via the hole 24a. Also, the wirings 25b to 25d in the peripheral circuit region B are connected to the underlying contact plugs 13c to 13e via the holes 24b to 24d respectively. Also, as shown in FIG. 2I, a ground wiring 25e is formed around the lower electrodes 16a in the memory cell region A, and this ground wiring 25e is connected to the contact plugs 13f on the second p-well 3b via the hole 24b. In addition, as shown in FIG. 2I, a leading wiring 25f is formed on the second local wiring 22b extended from the contact region 16b of the lower electrode 16a, and this leading wiring 25f is connected to the second local wiring 22b via the hole 24f.

The bit line 25a, the wirings 25b to 25d, the ground wiring 25e, and the leading wiring 25f act as the second layer metal wiring.

Then, steps required to obtain a situation shown in FIG. 1M and FIG. 2J will be explained hereunder.

First, a fourth interlayer insulating film 26 made of $SiO_2$ and having a thickness of 2.3 µm is formed on the third interlayer insulating film 24, the bit line 25a, the wirings 25c to 25d, etc. by the plasma CVD method using the TEOS gas and the oxygen ($O_2$) gas.

Then, an upper surface of the fourth interlayer insulating film 26 is planarized by polishing it by virtue of the CMP method.

In turn, the silicon substrate 1 is placed in the low pressure atmosphere, then the $N_2O$ gas and the $N_2$ gas are plasmanized in the atmosphere, and then the fourth interlayer insulating film 26 is exposed to the plasma for a time in excess of three minutes, preferably four minutes, while setting the substrate temperature to less than 450° C., e.g., 350° C. Accordingly, the moisture that entered into the fourth interlayer insulating film 26 in polishing can be discharged to the outside and the moisture is difficult to enter into the fourth interlayer insulating film 26.

If cavities are generated in the fourth interlayer insulating film 26, in some cases such cavities are exposed by polishing. Therefore, after the polishing, a cap layer (not shown) made of $SiO_2$ and having a thickness of more than 100 nm may be formed as an upper layer of the fourth interlayer insulating film 26. The cap layer is formed by the plasma CVD method using the TEOS gas and then exposed to the $N_2O$ plasma while setting the substrate temperature to 350° C.

Then, holes 26c, 26e for upper plugs are formed on the second layer wiring 25c in the peripheral circuit region B and the ground wiring 25e in the memory cell region A by patterning the fourth interlayer insulating film 26 by virtue of the photolithography method.

Figure 1N:
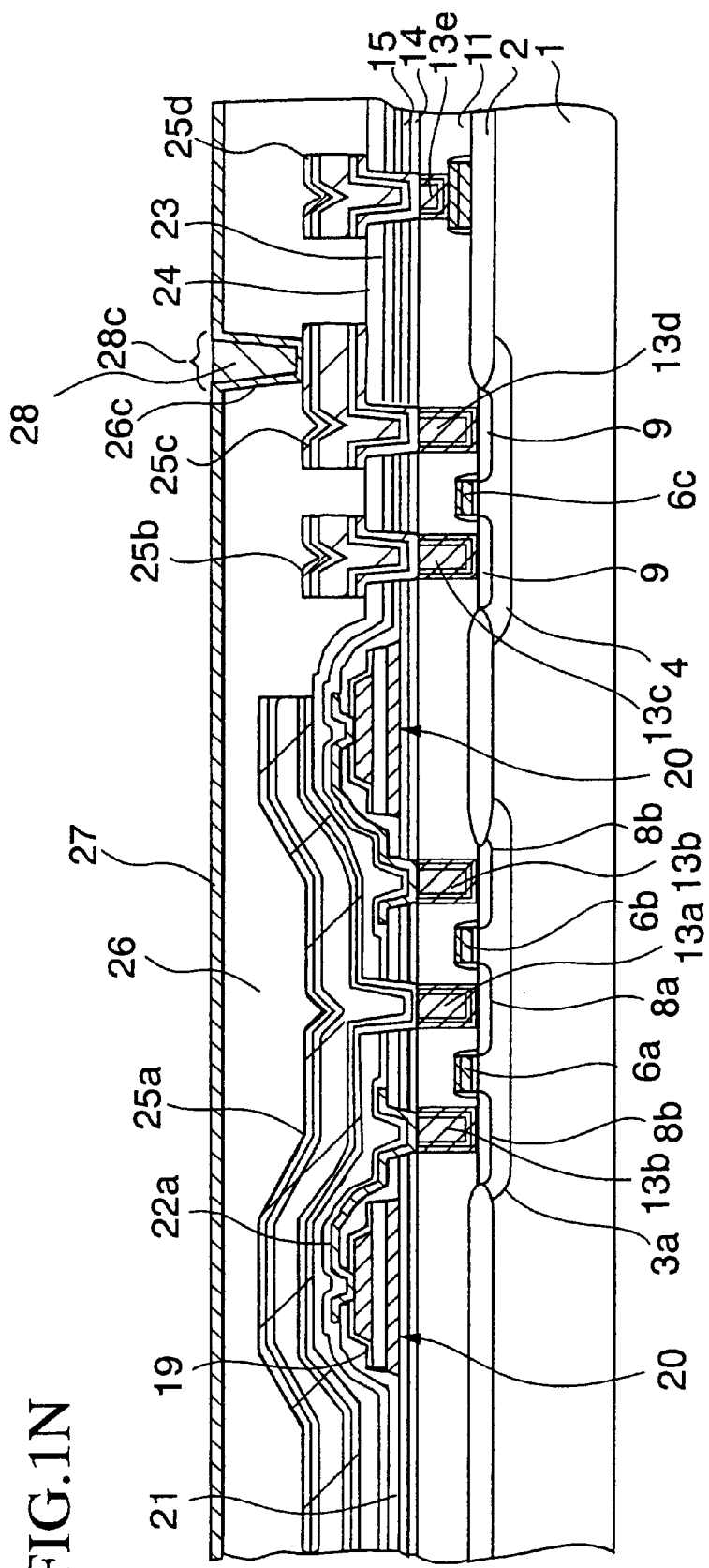
Figure 2K:
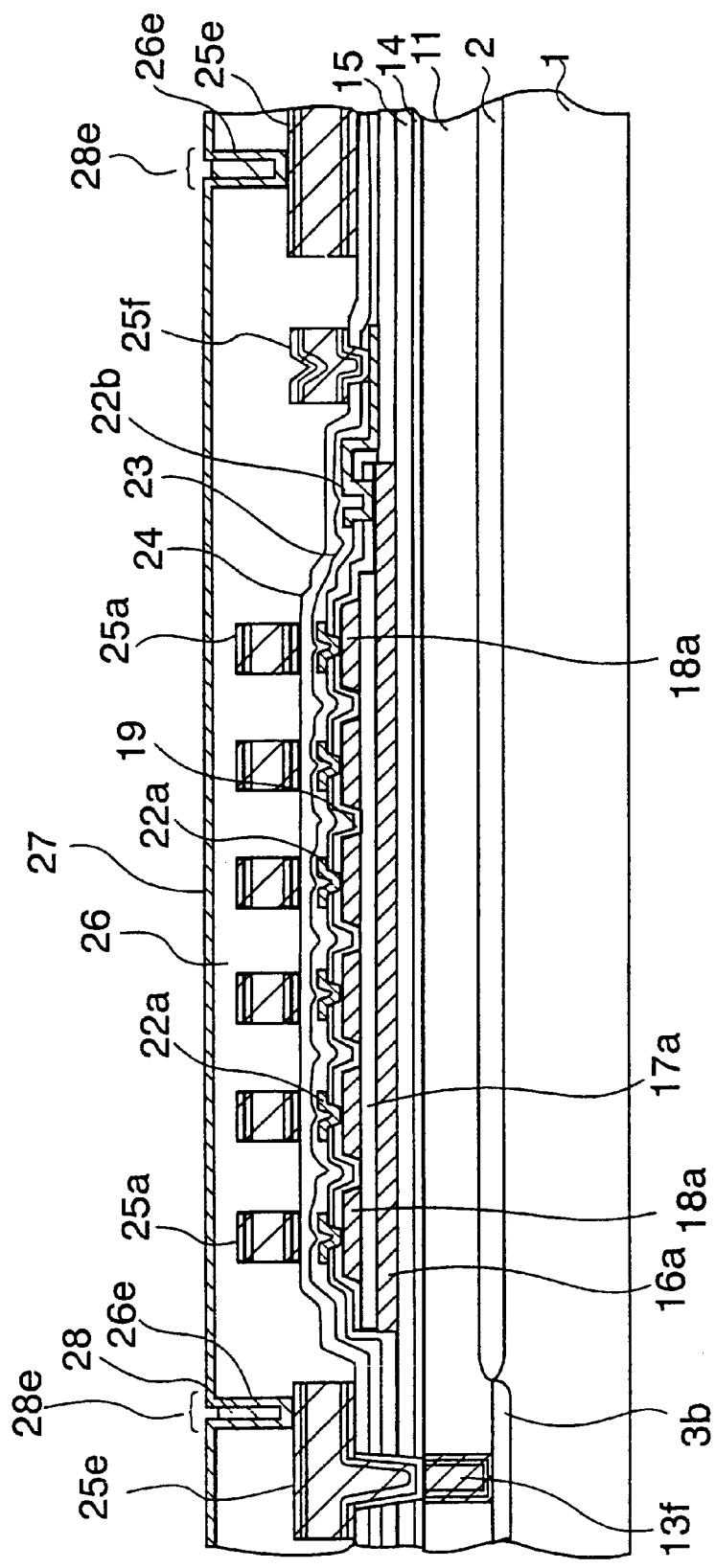

Then, steps required to get a structure shown in FIG. 1N and FIG. 2K will be explained hereunder.

First, a glue layer 27 having a double-layered structure consisting of Ti and TiN is formed by the sputter on the fourth interlayer insulating film 26 and in the plug holes 26c, 26e. Then, tungsten seeds (not shown) are formed on the glue layer 27 by the CVD method using the tungsten hexafluoride ($WF_6$) gas and the silane ($SiH_4$) gas. In addition, a tungsten film 28 is formed on the glue layer 27 by using the $WF_6$ gas, the $SiH_4$ gas, and the hydrogen ($H_2$) gas at the growth temperature of 430° C. Accordingly, the glue layer 27 and the tungsten film 28 are filled into the plug holes 26c, 26e.

Then, the tungsten film 28 is removed from an upper surface of the fourth interlayer insulating film 26 by the CMP method or the etching-back, but such tungsten film 28 is left only in the plug holes 26c, 26e. Here, it is not needed to remove the glue layer 27 on the fourth interlayer insulating film 26. In FIG. 1N and FIG. 2K, there is shown the case where the glue layer 27 is left on the fourth interlayer insulating film 26.

As a result, an upper plug (via) 28c is formed of the tungsten film 28 and the glue layer 27 that are left in the plug hole 26c on the wiring 25c in the peripheral circuit region B. Also, a plug 28e is formed of the tungsten film 28 and the glue layer 27 that are left in the plug hole 26e on the wiring 25e in the memory cell region A.

Figure 10:
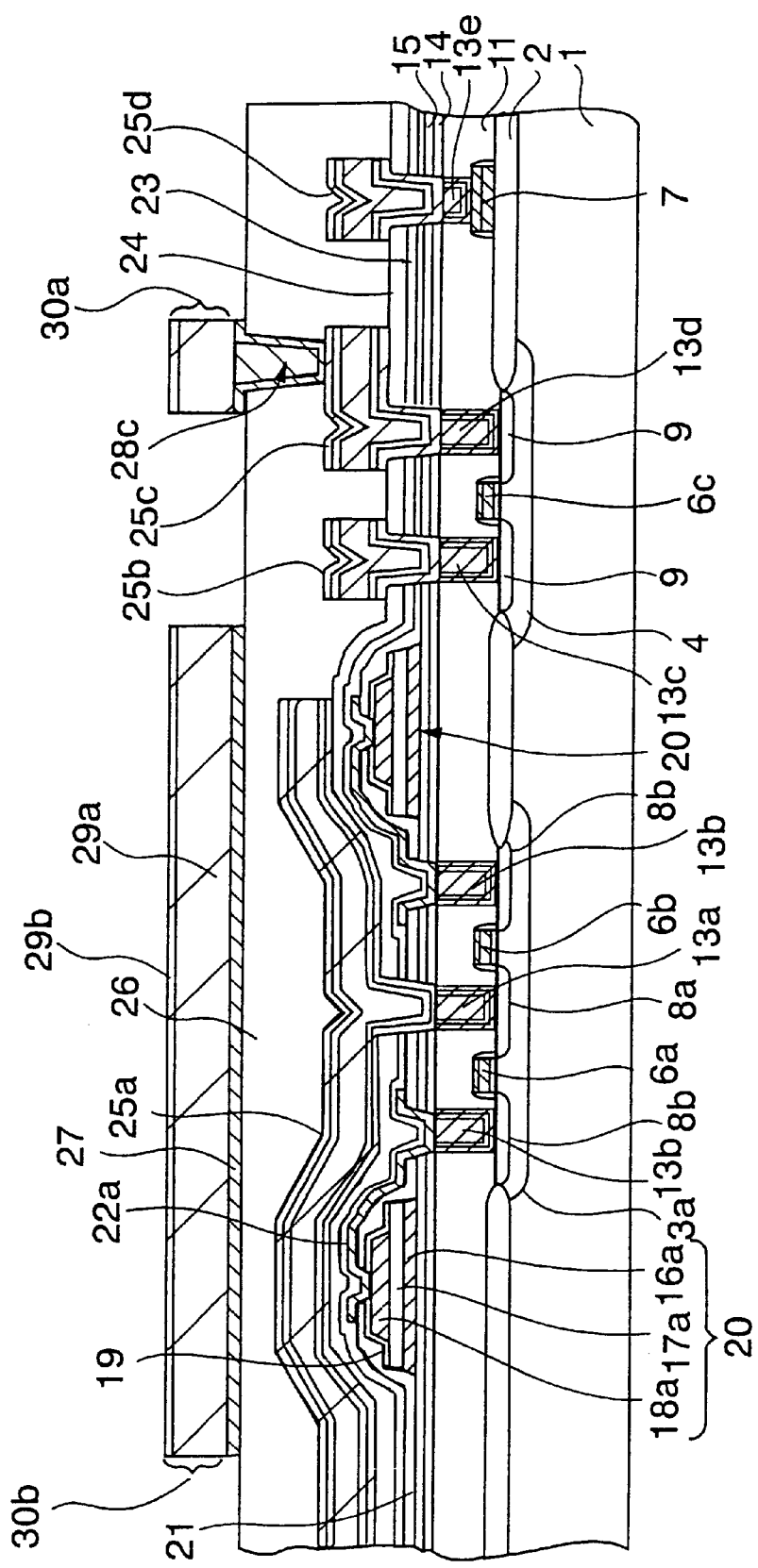

Then, steps required to get a structure shown in FIG. 10 and FIG. 2L will be explained hereunder.

First, an Al—Cu film 29a of 600 nm thickness and a TiN film 29b of 100 nm thickness are formed in sequence on the glue layer 27 and the plugs 28c, 28e. In case the glue layer 27 is removed from the upper surface of the fourth interlayer insulating film 26, a TiN film (not shown) is formed under the Al—Cu film 29a.

Then, the TiN film 29b, the the Al—Cu film 29a, and the glue layer 27 are patterned. Thus, a wiring 30a connected to the plug 28c in the peripheral circuit region B is formed, while a third protection film 30b for covering the ferroelectric capacitor 20 is formed in the memory cell region A. As shown in FIG. 2L, the third protection film 30b is electrically connected to the silicon substrate 1 via the upper plug 26e, the ground wiring 25e, the contact plugs 13f, and the second p-well 3b. In this case, the wiring 30a connected to the via 28c in the peripheral circuit region B is the third layer metal wiring.

Figure 3:
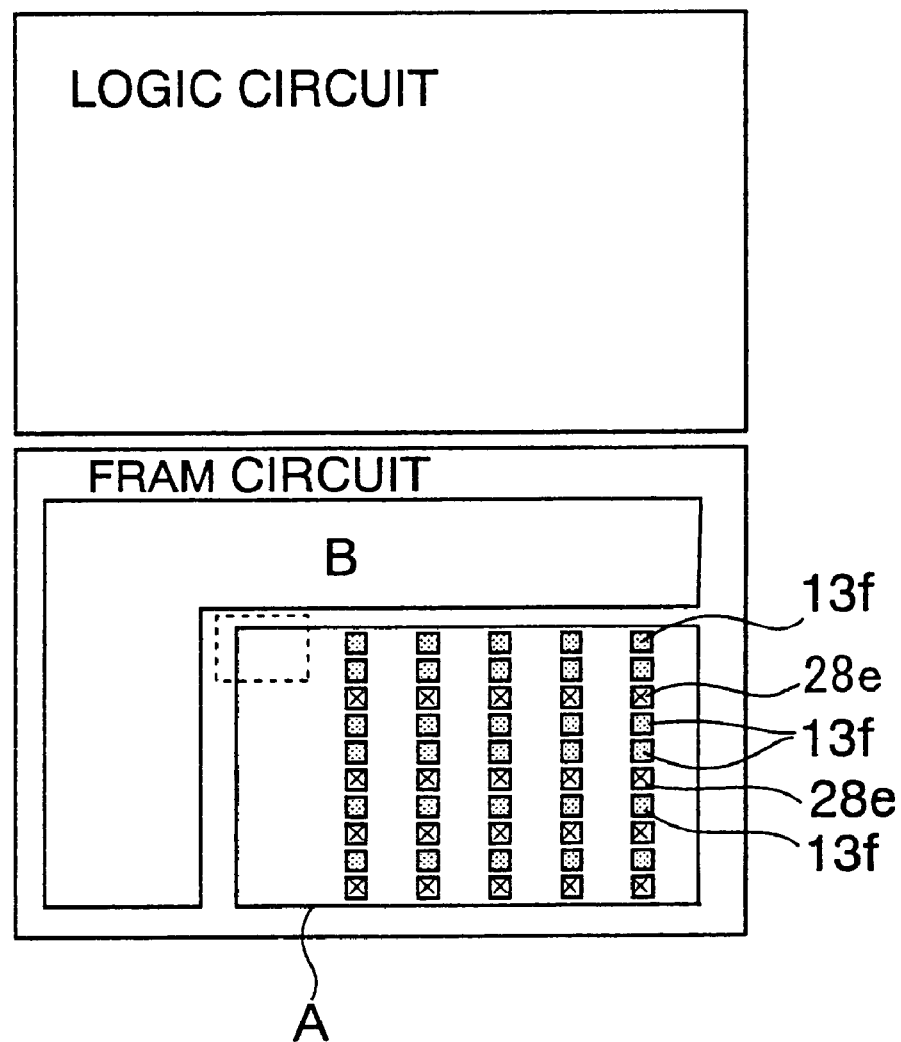
FIG. 3 is view showing circuit arrangement of the semiconductor device according to the embodiment of the present invention.

By the way, arrangement of the upper plug 28e and the contact plugs 13f connected to the third protection film 30b is schematically shown in FIG. 3.

In FIG. 3, arrangement of the hybrid FeRAM containing the logic circuit formed in one chip is shown, wherein the peripheral circuit region B is arranged adjacent to the memory cell region A in the FeRAM circuit. The ferroelectric capacitor cell is partitioned into several blocks in the memory cell region A, and the upper plugs 28e are arranged between the blocks. Sixteen upper plugs 28e are formed in the FeRAM in the present embodiment. The upper plugs 28c are connected to the ground wiring 25e. The contact plugs 13f connected under the ground wiring 25e are formed at different positions from the upper plugs 28e and are formed in the larger number than the upper plugs 28e (e.g., about 250 pieces).

Figure 4:
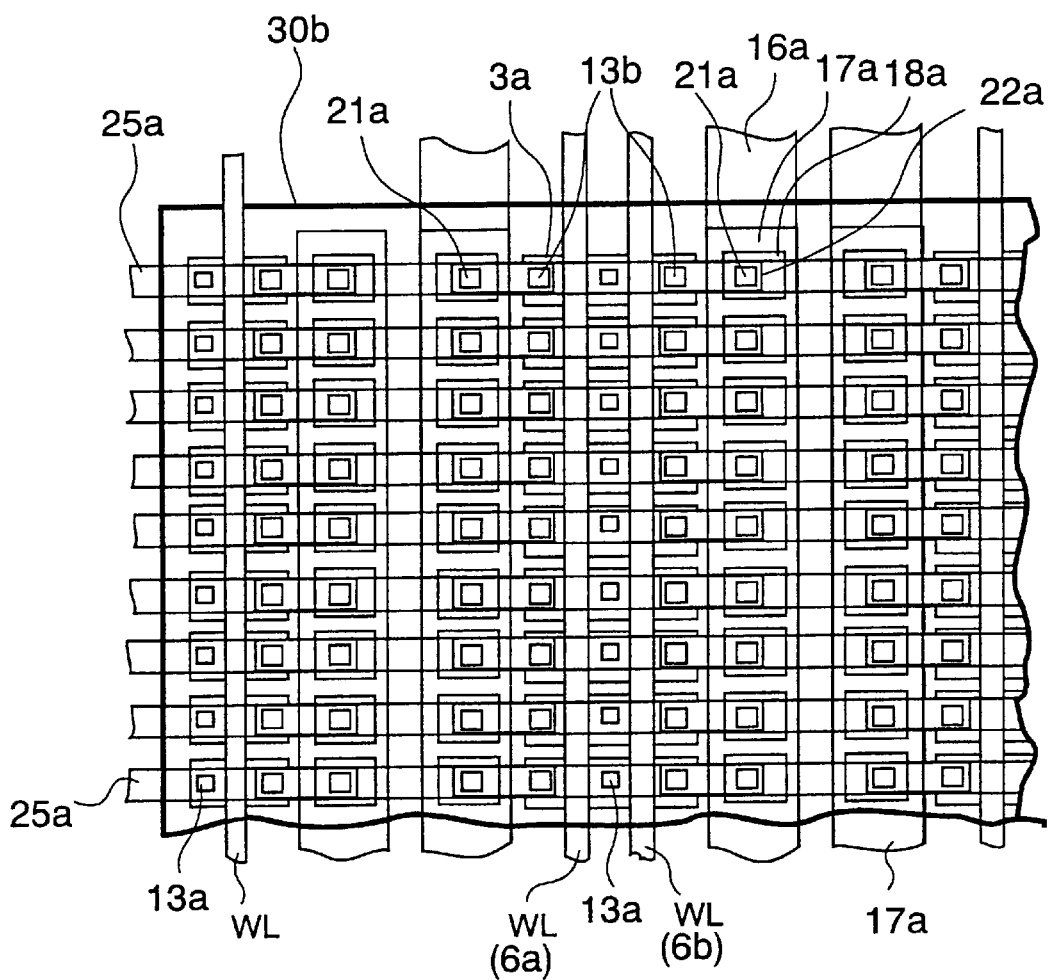
FIG. 4, FIG. 5, FIG. 6, and FIG. 7 are plan views showing arrangement relationship between a third protection film and respective conductive patterns of the semiconductor device according to the embodiment of the present invention.

In the region of the memory cell region A indicated by a broken line shown in FIG. 3, the third protection film 30b has a planar shape shown in FIG. 4, for example, to cover the entire of the memory cell region A. In this case, the insulating films are omitted in FIG. 4.

Figure 2M:
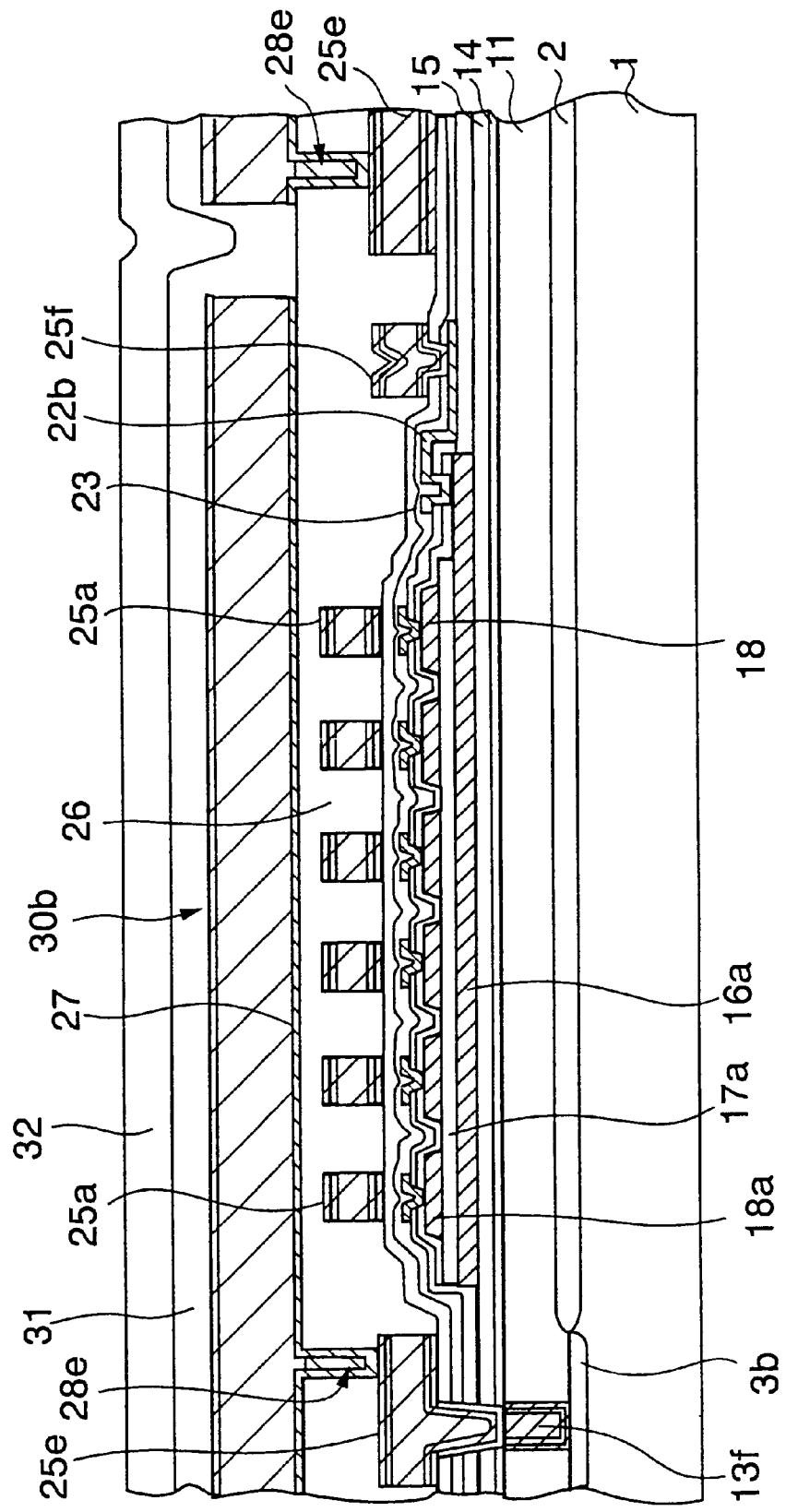

After the third protection film 30b is formed as above, as shown in FIG. 1P and FIG. 2M, a first cover insulating film 31 made of $SiO_2$ and having a thickness of 200 nm thickness, for example, is formed by the plasma CVD method using the TEOS to cover the third protection film 30b and the third layer wiring 30a. In addition, a second cover insulating film 32 made of silicon nitride is formed on the first cover insulating film 31 by the plasma CVD method using the silane and the ammonium to have a thickness of 500 nm, for example.

According to the above steps, a basic structure of the FeRAM including the ferroelectric capacitor 20 is formed.

The constituent material of the first protection film 19 or the second protection film 23 is not limited to the alumina, and thus the insulating material that is hard to permeate the hydrogen, e.g., PZT, $TiO_2$, AlN, $Si_3N_4$, or SiON may be employed. Also, a wiring having a two layers or more may be formed between the second protection film 23 and the third protection film 30b.

According to the above embodiments, since the ferroelectric capacitor 20 is covered with the second protection film 23 formed of alumina when the tungsten film 28 constituting the upper plugs 28c, 28e is formed, the degradation due to the reducing gas employed in forming the tungsten can be prevented. Also, since the ferroelectric capacitor 20 is covered with the first and second protection films 19, 23 and the third protection film 30b made of metal during when the second cover insulating film 32 made of silicon nitride is formed, the degradation of the ferroelectric capacitor 20 due to the reducing gas used to form the silicon nitride can be prevented.

Effects for preventing the reduction of the ferroelectric capacitor 20 by the first, second, and third protection films 19, 23, 30b, etc. will be explained in detail in the following.

(i) The Influence of Difference in the Layer Number of the Protection Films on the Imprint Characteristic of the Ferroelectric Capacitor When it was examined how the imprint characteristic of the ferroelectric capacitor 20 is affected by changing the combination of the first, second, and third protection films 19, 23, 30b, results given in Table 2 were derived.

TABLE 2

The imprint characteristic of the ferroelectric capacitor when the layer number of the protection films is changed (5 V evaluation)

| film structure | $\Delta Q (88)$ [$\mu C/cm^2$] |
|---|---|
| Only the first protection film | 5.4 |
| Only the second protection film | 9.8 |
| Only the third protection film | 18.0 |
| The first protection film + the second protection film | 2.4 |
| The first protection film + the third protection film | 2.5 |
| The first protection film + the second protection film + the third protection film | 0.1 |

In Table 2, $\Delta Q_{(88)}$ denotes a value obtained by subtracting the $Q_{(88)}$ obtained after process-out from the $Q_{(88)}$ obtained immediately after the ferroelectric capacitor 20 is formed. That is, the smaller $\Delta Q_{(88)}$ shows the less process degradation.

Where Q indicates difference in the polarization charge when the opposite signal is loaded into two pairs of ferroelectric capacitors of 2-transistor/2-capacitor type, and the $Q_{(88)}$ indicates a Q value obtained after the ferroelectric capacitor is baked at 150° C. for 88 hours. This Q is measured by applying the voltage of 5 V to the ferroelectric capacitor 20.

In Table 2, if only the first protection film 19 is employed without the formation of the second and third protection films 23, 30b, $\Delta Q_{(88)}$ becomes 5.4 $\mu C/cm^2$. Thus, it can be understood that the process degradation is caused in the ferroelectric capacitor 20.

Also, if the cases where any one of the first, second, and third protection films 19, 23, 30b is employed respectively are compared with each other, $\Delta Q_{(88)}$ of the first protection film 19 is smallest and then $\Delta Q_{(88)}$ is increased in the order of the second protection film 23 and the third protection film 30b, and thus the imprint characteristic becomes worse.

Therefore, it can be understood that, if only one protection film is selected, it is advantageous to form the protection film at as close the position as possible to the ferroelectric capacitor 20.

In the case of the single layer, the third protection film 30b that has the small process degradation suppressing effect can reduce $\Delta Q_{(88)}$ by 80 percent or more if it is used together with the first protection film 19, and thus the imprint characteristic can be improved largely. Similarly, the second protection film 23 can also reduce $\Delta Q_{(88)}$ by 70 percent or more if it is used together with the first protection film 19. In this manner, if the first protection film 19 as the protection film formed immediately on the ferroelectric capacitor 20 is combined with the second protection film 23 or the third protection film 30b formed over the first protection film 19, the large process degradation suppressing effect can be achieved respectively rather than the case of the single protection film.

In addition, if all the first, second, and third protection films 19, 23, 30b are combined together, $\Delta Q_{(88)}$ becomes 0.1

$\mu C/cm^2$. Thus, there can be achieved such a large merit that the process degradation in forming the multi-layered wiring on the ferroelectric capacitor 20 can be completely suppressed.

In the case of the single layer, $\Delta Q_{(88)}$ of the third protection film 30b is about two times large the second protection film 23.

Assume that the simple protection film combination effect can be achieved, it is expected that a Q value obtained when the first and third protection films 19, 30b are employed is larger than a Q value obtained when the first and second protection films 19, 23 are employed.

However, the Q value obtained when the first and second protection films 19, 23 are employed is almost similar to the Q value obtained when the first and third protection films 19, 30b are employed. Accordingly, there is caused the effect that cannot be simply expected based on the combination of the first, second, and third protection films 19, 23, 30b.

Because the film formed under the protection films 19, 23, 30b is brought into the baking-in-a-casserole state by the heat applied by the process for forming the overlying film on the protection films 19, 23, 30b, the moisture contained in the interlayer insulating film is spread downward to cause the degradation of the ferroelectric capacitor 20.

Accordingly, when two protection films are employed, the first protection film 19 that can block the moisture coming in from the immediate upper side of the ferroelectric capacitor 20 fills the important role. In addition, it is indispensable to dehydrate completely respective interlayer insulating films formed between the first protection film 19 and the second protection film 23 or the third protection film 30b. Therefore, in the present embodiment, the $N_2O$ plasma annealing at 350° C. that has the excellent dehydration effect is employed in the dehydration process of the second interlayer insulating film 21 being put between first protection film 19 and the second protection film 23 and the dehydration process of the third and fourth interlayer insulating films 24, 26 being put between first protection film 19 and the third protection film 30b.

According to Table 2, when the first protection film 19 is formed under the third protection film 30b, the effect for blocking the moisture contained in the interlayer insulating films by the first protection film 19 appears remarkably.

With the above, the reason for that $\Delta Q_{(88)}$ obtained when a combination of the first protection film 19 and the second protection film 23 is employed is almost similar to $\Delta Q_{(88)}$ obtained when a combination of the first protection film 19 and the third protection film 30b is employed is that such an effect that the first protection film 19 can suppress the influence of the moisture contained in the interlayer insulating films between two protection films can be achieved.

However, the degradation of the ferroelectric capacitor 20 caused when the second cover film 31 is formed by the reducing gas cannot be satisfactorily prevented only by the first protection film 19.

Therefore, in order to suppress satisfactorily the degradation of the ferroelectric capacitor 20, the first protection film 19 is indispensable and also at least one of the second protection film 23 and the third protection film 30b is needed.

(ii) The Influence of Difference in Methods of Forming a Film of Alumina Constituting the Protection Film on the Imprint Characteristic of the Ferroelectric Capacitor The influence of difference in methods of forming the alumina constituting the first and second protection films 19, 23 on the imprint characteristic was given in Table 3.

TABLE 3

The influence of difference in alumina film forming methods on the imprint characteristic (3 V evaluation)

| Film structure | RF alumina | | Helicon alumina | |
| --- | --- | --- | --- | --- |
| | Q (88) [$\mu C/cm^2$] | Q rate [%] | Q (88) [$\mu C/cm^2$] | Q rate [%] |
| The first protection film | 11.6 | −8.0 | 10.0 | −9.3 |
| The first protection film + the second protection film | 12.8 | −7.0 | 16.7 | −4.4 |
| The first protection film + the third protection film | 16.4 | −5.1 | 13.6 | −6.2 |
| The first protection film + the second protection film + the third protection film | 18.4 | −3.1 | 19.9 | −2.4 |

In Table 3, the RF alumina means alumina that is formed by the RF sputter equipment, and the helicon alumina means alumina that is formed by the helicon sputter equipment. The helicon sputter equipment can form the dense alumina rather than the case where the RF sputter equipment is employed since it has a structure in which the RF coil is arranged over the target to enhance the plasma density.

As the alumina film forming conditions by the helicon sputter equipment used in the experiment of Table 3, the pressure in the chamber is set to 1 mTorr, the RF power applied to the target is set to 600 W, the power applied to the RF coil is set to 60 W, the aluminum target is used as the target, and an argon gas and an oxygen ($O_2$) gas are introduced into the chamber at flow rates of 20 sccm and 7.6 sccm respectively.

In Table 3, Q is measured by applying the low voltage of 3 V to the ferroelectric capacitor 20. The evaluation at the low voltage of 3 V is performed in view of the low voltage drive of the FeRAM.

When the evaluation of the ferroelectric capacitor 20 by applying the low voltage of 3 V is carried out, in the case of the RF alumina, the imprint characteristic is not so improved even if the second protection film 23 is formed on the first protection film 19. In contrast, in the case of the helicon alumina, the improvement of the imprint characteristic appears if the second protection film 23 is formed on the first protection film 19.

In the structure in which all the first, second, and third protection films 19, 23, 30b are employed, the helicon alumina is superior in the imprint characteristic of the ferroelectric capacitor 20 to the RF alumina.

According to the above, it can be understood that, when the FeRAM is operated at the low voltage, it is advantageous to form the first protection film 19 and the second protection film 23 by using not the RF alumina but the helicon alumina.

(iii) The Influence of Difference in Film Thickness of the Second Protection Film on the Imprint Characteristic of the Ferroelectric Capacitor When the influence of difference in film thickness of the second protection film 23 on the imprint characteristic of the ferroelectric capacitor was examined, results shown in Table 4 were derived.

TABLE 4

The influence of difference in film thickness of the
second protection film on the imprint characteristic
(5 V evaluation)

| Film thickness of the second protection film | Q (88) [μC/cm²] | Q rate [%] |
|---|---|---|
| 0 nm | 16.3 | −6.4 |
| 15 nm | 19.5 | −4.8 |
| 20 nm | 19.8 | −4.7 |
| 50 nm | 20.3 | −4.3 |
| 70 nm | 20.9 | −4.8 |

Table 4 shows the evaluation when the second protection film 23 is formed by the RF alumina. The third protection film 30b is not employed. In addition, Q is measured by applying the voltage of 5 V to the ferroelectric capacitor 20.

According to Table 4, if the film thickness exceeds 15 nm, the imprint characteristic of the ferroelectric capacitor 20 can be apparently improved in contrast to the case where the second protection film 23 is not formed (film thickness=0). The larger film thickness is better, but there is no significant difference in the values Of Q($_{88}$) and Q rate. Also, since the coverage is not so good when the film thickness is set to 10 nm, there is the possibility that the protection film cannot completely cover the ferroelectric capacitor 20 that has a large level difference on the surfaces.

(iv) The Influence of Difference in Potential of the Third Protection Insulating Film on the Retention Characteristic of the Ferroelectric Capacitor The influence of difference in potential of the third protection film 30b made of the conductive film on the retention characteristic of the ferroelectric capacitor 20 is shown in Table 5.

TABLE 5

The influence of potential of the third protection
film on the retention characteristic
(plastic package evaluation)

| 150 □ high-temperature holding test | | 24 h | 72 h | 168 h | 288 h | 504 h | 1008 h |
|---|---|---|---|---|---|---|---|
| (A) | Defect number/ test piece number | 0/50 | 0/50 | 0/50 | 0/50 | 0/50 | 13/50 |
|  | Fraction defective | 0.0% | 0.0% | 0.0% | 0.0% | 0.0% | 26.0% |
| (B) | Defect number/ test piece number | 0/50 | 0/50 | 0/50 | 0/50 | 0/50 | 1/50 |
|  | Fraction defective | 0.0% | 0.0% | 0.0% | 0.0% | 0.0% | 2.0% |

(A) Third protection film provided/floating potential
(B) Third protection film provided/earth potential As described above, the third protection film 30b is formed of the same metal film as the third layer wiring 30a. Also, as shown in FIG. 3, the ferroelectric capacitor 20 has a structure that it is covered with the third protection film 30b.

The retention characteristic was evaluated under two states, i.e., the case where the third protection film 30b is electrically connected to the silicon substrate 1 and is set to the earth potential, and the case where the third protection film 30b is not connected to the via 28e and is set to the floating potential.

The retention characteristic was evaluated depending upon whether or not the signal of the ferroelectric capacitor 20 being left at the high-temperature atmosphere of 150° C. can be normally loaded/read.

The actual devices of 50 chips having respective structures were incorporated into the plastic package (not shown). In the semiconductor memory device formed in the chip used in the experiment in Table 5, the structure in which the second protection film 23 is not formed is employed.

As shown in Table 5, under both conditions that the third protection film 30b is set to the floating potential and the third protection film 30b is set to the earth potential, the signal of the ferroelectric capacitor 20 was able to be loaded/read without problem in the high-temperature holding until 504 hours.

However, when the holding time exceeds 1000 hours, the fraction defective was abruptly increased in the case where the third protection film 30b is set to the floating potential whereas one defective chip is produced in the case where the third protection film 30b is set to the earth potential. But apparently the fraction defective could be reduced rather than the case where the third protection film 30b is set to the floating potential.

It may be supposed that there are two reasons that the fraction defective of the ferroelectric capacitor 20 can be reduced by setting the third protection film 30b to the earth potential in this manner.

First, as set forth in Patent Application Publication (KOKAI) Hei 7-153921 and Patent Application Publication (KOKAI) Hei 2-5416, the permeation of the moisture can be suppressed. Accordingly, the degradation of the ferroelectric capacitor 20 can be prevented. Exactly speaking, this is because entering of the hydrogen ion used in forming the second cover film 32 made of silicon nitride can be suppressed. The prevention of the entering of the "hydrogen ion" is different in the strict meaning from the prevention of the permeation of the "hydrogen atoms" and the "moisture", as set forth in Patent Application Publication (KOKAI) Hei 7-153921.

Second, the mutual coupling that is caused between the bit line 25a and the bit line 25a via the third protection film 30b can be eliminated by setting the third protection film 30b to the earth potential, and thus the effect of suppressing the fluctuation in potential of the bit line 25a can be achieved. In other words, when the third protection film 30b is set to the floating potential, the large fraction defective of the ferroelectric capacitor 20 is caused by the fluctuation in potential of the bit line 25a. In other words, the fluctuation in potential of the bit line 25a affects the retention characteristic with the degradation of the ferroelectric capacitor 20.

Therefore, the mechanism applied to suppress the mutual coupling between the bit lines 25a by the third protection film 30b when such third protection film 30b is set to the earth potential is different to that applied "to remove the charged charges" and "to remove effectively the static electricity", as set forth in Patent Application Publication (KOKAI) Hei 7-153921 and Patent Application Publication (KOKAI) Hei 2-5416.

In this case, in Patent Application Publication (KOKAI) Hei 7-153921 and Patent Application Publication (KOKAI) Hei 2-5416, no recitation about the dehydration process of the interlayer insulating films under the plate and the formation of the bit line under the plate that is kept as the earth potential is given.

As described above, it has been found that, in order to improve the retention performance of the ferroelectric capacitor 20, it is effective to set the potential of the third protection film 30b to the earth level.

(v) The Pattern of the Third Protection Film

In FIG. 4, the third protection film 30b has a shape to cover the entire region of the memory cell region A. However, since the third protection film 30b must cover at least respective ferroelectric capacitors 20, it may be formed to have shapes shown in FIG. 5, FIG. 6 and FIG. 7.

Figure 5:
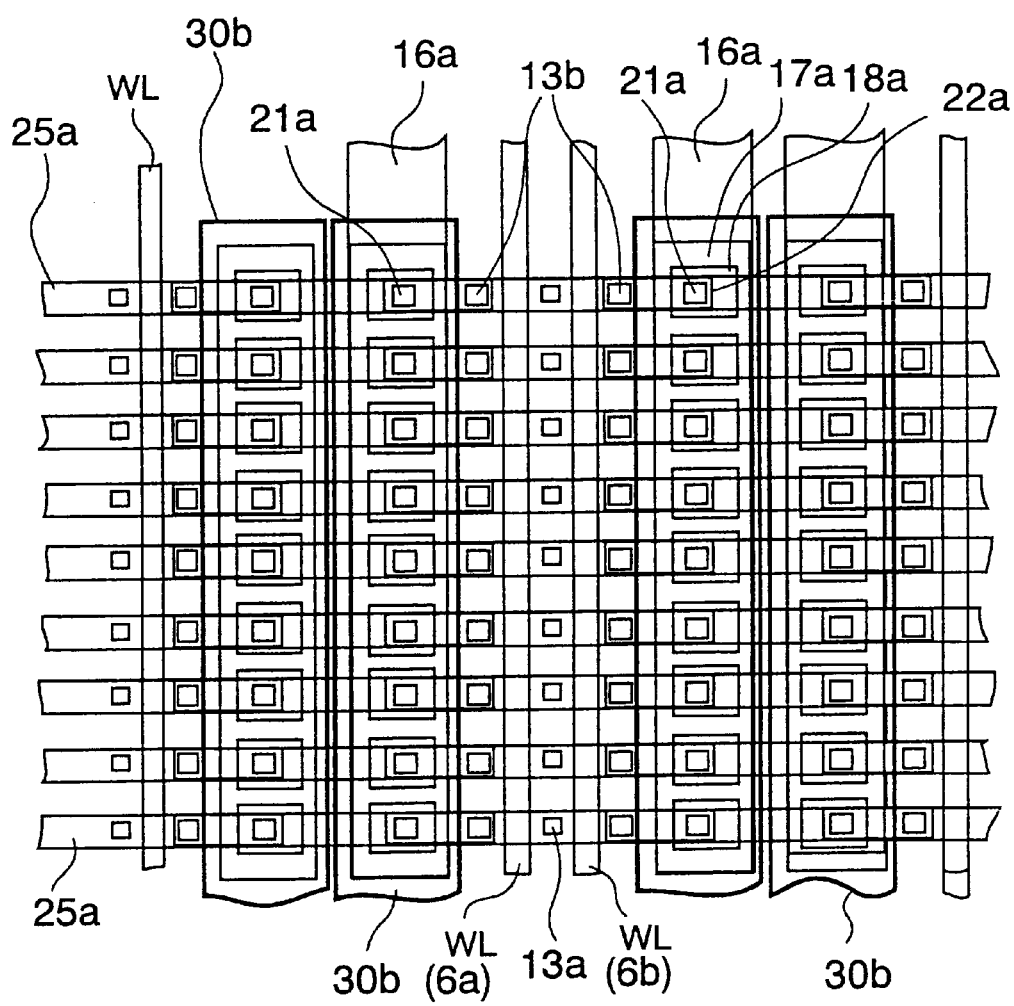

The third protection film 30b made of metal shown in FIG. 5 is formed in parallel with the lower electrodes 16a of the ferroelectric capacitors 20 to cover the upper electrodes 18a. Then, the third protection film 30b is at the earth potential by the structure shown in FIG. 2M.

Figure 6:
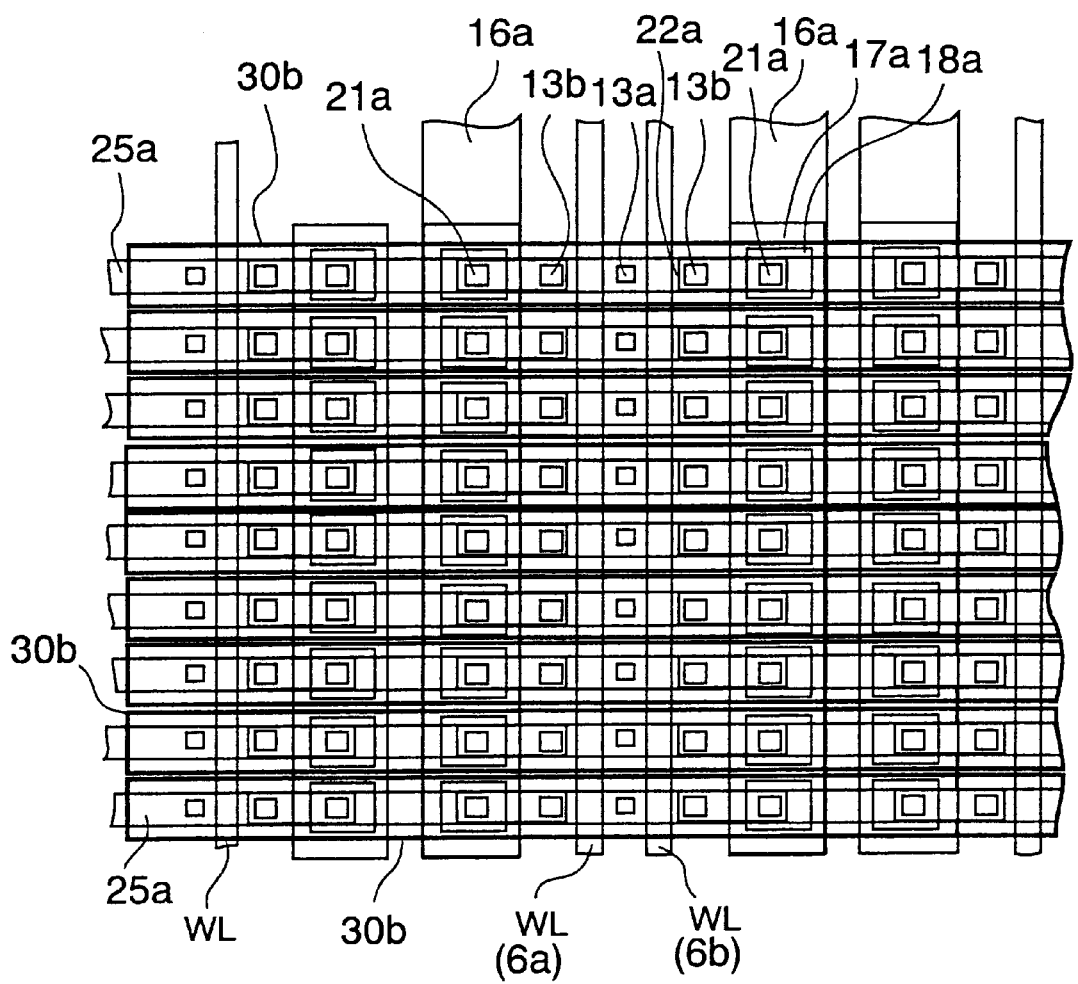

The third protection film 30b made of metal shown in FIG. 6 is formed in parallel with the bit lines 25a to cover at least the upper electrodes 18a of the ferroelectric capacitors 20. Then, the third protection film 30b is at the earth potential by the structure shown in FIG. 2M. FIG. 5, FIG. 6, and FIG. 25 are depicted while omitting the insulating films and the p-well.

Figure 7:
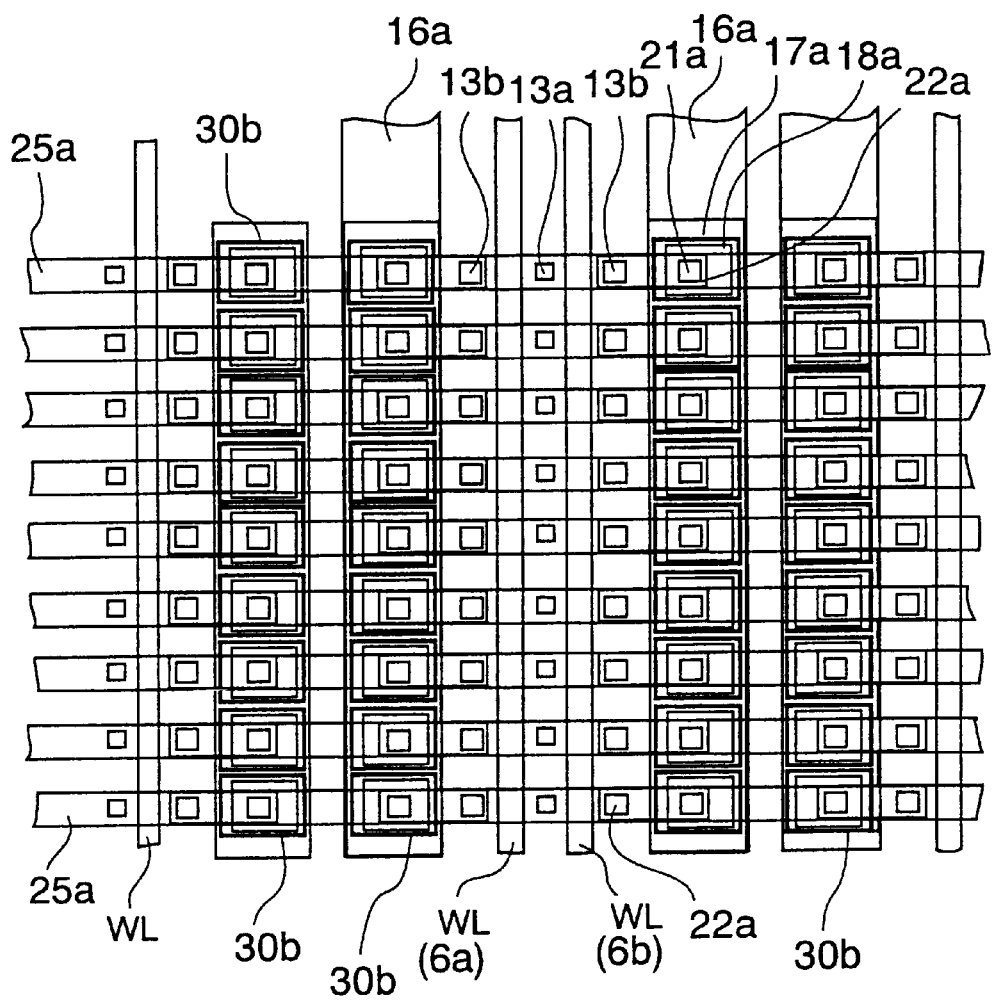

The third protection film 30b made of metal shown in FIG. 7 is formed to individually cover at least the upper electrodes 18a of the ferroelectric capacitors 20. Then, the third protection film 30b is at the earth potential by the structure shown in FIG. 2M.

According to the third protection films 30b shown in FIG. 5, FIG. 6 or FIG. 7, the third protection films 30b having all shapes are set to the earth potential. Therefore, like the case of the shape shown in FIG. 4, the retention performance of the ferroelectric capacitors 20 can be improved by preventing the enter of the reducing gas into the ferroelectric capacitors 20 and the preventing the mutual coupling between the bit lines 25a.

As described above, according to the present invention, the surface (at least the upper electrodes and their peripheral regions) of the ferroelectric or high-dielectric capacitors is covered with the first protection film, then the second protection film is formed to cover the capacitors on the first wirings formed on the capacitors, then the second wirings are formed over the second protection film, then the third protection film is formed to cover the ferroelectric capacitors over the second wirings, and then the third protection film is set to the earth potential, whereby the first protection film and the second protection film, or the first protection film and the third protection film are employed.

According to this, even when the insulating films and the conductive films are formed or etched over the ferroelectric or high-dielectric capacitors by using the reducing atmosphere, the ferroelectric or high-dielectric films of the capacitors can be protected from the reducing atmosphere by the first protection film, the second protection film, or the third protection film underlying the films which are subjected to these processes. Therefore, the imprint characteristic of the ferroelectric capacitors can be improved and also the retention performance peculiar to the FeRAM can be improved.

What is claimed is:

1. A method of manufacturing a semiconductor device comprising the steps of:

forming a transistor having a first impurity diffusion layer and a second impurity diffusion layer formed in a semiconductor substrate and an electrode formed above the semiconductor substrate;

forming a first insulating film to cover the transistor;

forming a first conductive film, a ferroelectric or high-dielectric film, and a second conductive film in sequence above the first insulating film;

forming an upper electrode of a capacitor by patterning the second conductive film;

forming a dielectric film of the capacitor by patterning the ferroelectric or high-dielectric film;

forming a first capacitor protection film to cover the upper electrode and the dielectric film;

leaving the first capacitor protection film on at least the upper electrode and the dielectric film;

forming a lower electrode of the capacitor by patterning the first conductive film;

forming a second insulating film above the first insulating film and the first capacitor protection film;

forming a first hole on the upper electrode by patterning the first protection film and the second insulating film;

forming a second hole above the first impurity diffusion layer by patterning the first insulating film and the second insulating film;

forming a first wiring, that electrically connects the upper electrode and the first impurity diffusion layer via the first hole and the second hole, above the second insulating film;

forming a second capacitor protection film over the first wiring and the second insulating film to cover at least the capacitor;

forming a third insulating film to cover the second capacitor protection film; and forming a second wiring over the third insulating film.

2. A method of manufacturing a semiconductor device comprising the steps of:

forming a transistor having a first impurity diffusion layer and a second impurity diffusion layer formed in a semiconductor substrate and an electrode formed above the semiconductor substrate;

forming a first insulating film to cover the transistor;

forming a first conductive film, a ferroelectric or high-dielectric film, and a second conductive film in sequence above the first insulating film;

forming an upper electrode of a capacitor by patterning the second conductive film;

forming a dielectric film of the capacitor by patterning the ferroelectric or high-dielectric film;

forming a first capacitor protection film to cover the upper electrode and the dielectric film;

leaving the first capacitor protection film on at least the upper electrode and the dielectric film;

forming a lower electrode of the capacitor by patterning the first conductive film;

forming a second insulating film above the first insulating film and the first capacitor protection film;

forming a first hole on the upper electrode by patterning the first protection film and the second insulating film;

forming a second hole above the first impurity diffusion layer by patterning the first insulating film and the second insulating film;

forming a first wiring, that electrically connects the upper electrode and the first impurity diffusion layer via the first hole and the second hole, above the second insulating film;

forming a third insulating film to cover the first wiring;

forming a ground hole at a side region of the capacitor by patterning the first and second and third insulating films;

forming a second wiring above the third insulating film;

forming a ground wiring above the third insulating film, the ground wiring connected electrically to the semiconductor substrate via the ground hole;

forming a fourth insulating film above the third insulating film to cover the second wiring and the ground wiring; and forming a second capacitor protection film formed of a conductive film above the fourth insulating film and over at least the capacitor, the second capacitor protection film connected electrically to the ground wiring.

3. A method of manufacturing a semiconductor device comprising the steps of:

forming a transistor having a first impurity diffusion layer and a second impurity diffusion layer formed in a semiconductor substrate and an electrode formed above the semiconductor substrate;

forming a first insulating film to cover the transistor;

forming a first conductive film, a ferroelectric or high-dielectric film, and a second conductive film in sequence above the first insulating film;

forming an upper electrode of a capacitor by patterning the second conductive film;

forming a dielectric film of the capacitor by patterning the ferroelectric or high-dielectric film;

forming a first capacitor protection film to cover the upper electrode and the dielectric film;

leaving the first capacitor protection film on at least the upper electrode and the dielectric film;

forming a lower electrode of the capacitor by patterning the first conductive film;

forming a second insulating film above the first insulating film and the first capacitor protection film;

forming a first hole on the upper electrode by patterning the first protection film and the second insulating film;

forming a second hole above the first impurity diffusion layer by patterning the first insulating film and the second insulating film;

forming a first wiring, that electrically connects the upper electrode and the first impurity diffusion layer via the first hole and the second hole, above the second insulating film;

forming a second capacitor protection film over the first wiring and the second insulating film to cover at least the capacitor;

forming a third insulating film to cover the second capacitor protection film;

forming a ground hole at a side region of the capacitor by patterning the first insulating film, the second insulating film, and the third insulating film;

forming a second wiring above the third insulating film;

forming a ground wiring above the third insulating film, the ground wiring connected electrically to the semiconductor substrate via the ground hole;

forming a fourth insulating film above the third insulating film to cover the second wiring and the ground wiring;

forming a third conductive film above the fourth insulating film;

forming a third capacitor protection film above the fourth insulating film and over at least the capacitor by patterning the third conductive film, the third capacitor protection film connected electrically to the ground wiring; and forming a third wiring by patterning the third conductive film.

4. A method of manufacturing a semiconductor device according to claim 3, wherein dehydration process is applied to the second insulating film, the third insulating film, and the fourth insulating film after respective film formations.

5. A method of manufacturing a semiconductor device according to claim 4, wherein the dehydration process is executed by $N_2O$ plasma annealing.

6. A method of manufacturing a semiconductor device according to claim 3, further comprising the step of:

forming a cover insulating film above the third capacitor protection film by using a reducing gas.

7. A method of manufacturing a semiconductor device according to claim 3, wherein the first capacitor protection film and the second capacitor protection film are formed of alumina.

8. A method of manufacturing a semiconductor device according to claim 3, wherein at least one of the first capacitor protection film and the second capacitor protection film is formed by a helicon sputter method.

* * * * *